United States Patent
Choi et al.

(10) Patent No.: US 9,496,460 B2
(45) Date of Patent: Nov. 15, 2016

(54) LIGHT EMITTING DEVICE, ELECTRODE STRUCTURE, LIGHT EMITTING DEVICE PACKAGE, AND LIGHTING SYSTEM

(71) Applicant: LG INNOTEK CO., LTD., Seoul (KR)

(72) Inventors: Kwang Ki Choi, Seoul (KR); Hwan Hee Jeong, Seoul (KR); Sang Youl Lee, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/055,657

(22) Filed: Oct. 16, 2013

(65) Prior Publication Data
US 2014/0042486 A1 Feb. 13, 2014

Related U.S. Application Data

(63) Continuation of application No. 13/032,304, filed on Feb. 22, 2011, now Pat. No. 8,723,203.

(30) Foreign Application Priority Data

Mar. 22, 2010 (KR) .................. 10-2010-0025148

(51) Int. Cl.
*H01L 33/58* (2010.01)
*H01L 29/00* (2006.01)
*H01L 33/38* (2010.01)
*H01L 33/44* (2010.01)
*F21V 8/00* (2006.01)

(52) U.S. Cl.
CPC ............... *H01L 33/38* (2013.01); *H01L 33/44* (2013.01); *G02B 6/0073* (2013.01); *H01L 33/58* (2013.01); *H01L 2224/48091* (2013.01); *H01L 2224/48247* (2013.01); *H01L 2924/12032* (2013.01)

(58) Field of Classification Search
CPC .................... H01L 33/58; H01L 2924/12032
USPC ................... 257/98, E33.068, 100
See application file for complete search history.

(56) References Cited

U.S. PATENT DOCUMENTS 6,255,129 B1   7/2001   Lin ................................ 438/26
7,582,905 B2   9/2009   Tamura et al.
(Continued)

FOREIGN PATENT DOCUMENTS

CN   1938869 A   3/2007
CN   101438423 A   5/2009
(Continued)

OTHER PUBLICATIONS

Korean Office Action dated Aug. 9, 2011 issued in Application No. 10-2010-0025148.
(Continued)

*Primary Examiner* — Lynne Gurley
*Assistant Examiner* — Vernon P Webb
(74) *Attorney, Agent, or Firm* — KED & Associates LLP

(57) ABSTRACT

Provided are a light emitting device, an electrode structure, a light emitting device package, and a lighting system. The light emitting device includes a light emitting structure layer comprising a first semiconductor layer, a second semiconductor layer, and an active layer. An electrode disposed on a top surface of the first semiconductor layer, a first layer includes a transmittive oxide material between the top surface of the first semiconductor layer and the electrode, and a second layer disposed is disposed between the first layer and the electrode, wherein the first layer is formed in a different material from the second layer, wherein the electrode comprises a lower portion connected to the first semiconductor layer and an upper portion on a top surface of the second layer.

20 Claims, 16 Drawing Sheets

(56) References Cited

U.S. PATENT DOCUMENTS

| | | |
|---|---|---|
| 7,791,098 B2 | 9/2010 | Sakamoto et al. |
| 8,309,972 B2 | 11/2012 | Shum et al. |
| 2005/0218415 A1 | 10/2005 | Tanaka et al. ............ 257/94 |
| 2006/0091405 A1 | 5/2006 | Kwak ...................... 257/79 |
| 2006/0273327 A1 | 12/2006 | Im |
| 2007/0145380 A1* | 6/2007 | Shum ............ H01L 33/385 257/79 |
| 2009/0108250 A1* | 4/2009 | Kim et al. ............... 257/13 |
| 2009/0134416 A1 | 5/2009 | Lee ......................... 257/98 |
| 2011/0062412 A1 | 3/2011 | Song |

FOREIGN PATENT DOCUMENTS

| | | |
|---|---|---|
| KR | 10-2009-0043057 A | 5/2009 |
| KR | 10-2009-0103217 A | 10/2009 |
| KR | 10-2010-0026455 A | 3/2010 |
| TW | 200625686 A | 7/2006 |
| WO | WO 2006/028118 A1 | 3/2006 |

OTHER PUBLICATIONS

Korean Notice of Allowance dated May 1, 2012 issued in Application No. 10-2010-0025148.
Chinese Office Action dated Dec. 25, 2012 issued in Application No. 201110040320.6.
U.S. Office Action dated Dec. 20, 2012 for U.S. Appl. No. 13/032,304.
U.S. Office Action dated Jul. 2, 2013 for U.S. Appl. No. 13/032,304.
European Search Report dated Apr. 3, 2014, issued in Application No. 11 15 3929.

* cited by examiner

LIGHT EMITTING DEVICE, ELECTRODE STRUCTURE, LIGHT EMITTING DEVICE PACKAGE, AND LIGHTING SYSTEM

CROSS-REFERENCE TO RELATED APPLICATIONS

This application is a Continuation of co-pending U.S. patent application Ser. No. 13/032,304 filed on Feb. 22, 2011, which claims priority under 35 U.S.C. §119(a) of Korean Patent Application No. 10-2010-0025148 filed on Mar. 22, 2010, which is hereby incorporated by reference in its entirety.

BACKGROUND

Embodiment relate to a light emitting device, an electrode structure, a light emitting device package, and a lighting system.

Due to their physical and chemical characteristics, Group III-V nitride semiconductors are being esteemed as core materials for light-emitting devices such as light-emitting diodes (LEDs) and laser diodes (LDs). Each of the Group III-V nitride semiconductors is formed of a semiconductor material having a compositional formula of $In_xAl_yGa_{1-x-y}N$ ($0 \leq x \leq 1$, $0 \leq y \leq 1$, $0 \leq x+y \leq 1$).

LEDs are a kind of semiconductor device that is used as a light source or uses the characteristics of compound semiconductors to convert electricity into infrared rays or light, thereby receiving or transmitting signals therebetween.

These semiconductor based LEDs or LDs are widely used in light-emitting devices, and are applied as light sources for various products such as keypad light-emitting units of mobile phones, electric light panels, and illumination devices.

SUMMARY

Embodiments provide a new electrode structure and a light emitting device having the same.

Embodiments provide an electrode structure having improved light extraction efficiency and a light emitting device having the same.

Embodiments provide a light emitting device having an electrode structure including a light guide layer between a semiconductor layer and an electrode.

Embodiments provide a light emitting device package including a light emitting device having a new electrode structure and a lighting system.

An embodiment provides a light emitting device comprising: a light emitting structure layer comprising a first semiconductor layer, a second semiconductor layer under a top surface of the first semiconductor layer, and an active layer between the first semiconductor layer and the second semiconductor layer; an electrode on a top surface of the first semiconductor layer; a first layer including a transmittive oxide material between the top surface of the first semiconductor layer and the electrode; and a second layer disposed between the first layer and the electrode to transmit a light incident through the first layer, wherein the first layer is formed in a different material from the second layer, wherein the electrode comprises a lower portion connected to the first semiconductor layer and an upper portion on a top surface of the second layer.

An embodiment provides a light emitting device comprising: a light emitting structure layer comprising a first semiconductor layer, a second semiconductor layer under a top surface of the first semiconductor layer, and an active layer between the first semiconductor layer and the second semiconductor layer; an electrode on a top surface of the first semiconductor layer; a first layer including a transmittive oxide material between the top surface of the first semiconductor layer and the electrode; and a second layer disposed between the first layer and the electrode to transmit a light incident through the first layer, wherein the first layer is formed in a different material from the second layer, wherein the electrode comprises a lower portion connected to the first semiconductor layer and an upper portion on a top surface of the second layer, wherein the first and second layer have a hole therein, wherein the lower portion of the electrode is disposed in the hole of the first and second layers.

The details of one or more embodiments are set forth in the accompanying drawings and the description below. Other features will be apparent from the description and drawings, and from the claims.

DETAILED DESCRIPTION OF THE EMBODIMENTS

Figure 1:
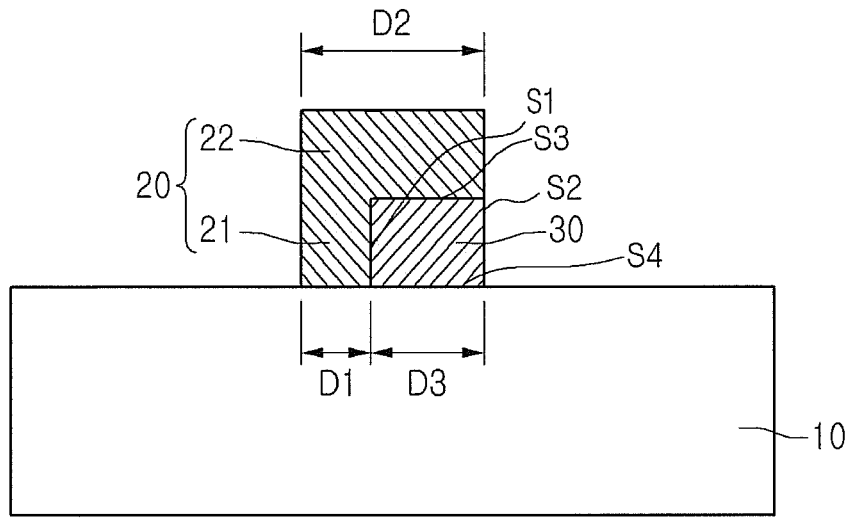
FIG. 1 is a side-sectional view of an electrode structure on a compound semiconductor layer according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, embodiments will be described with reference to accompanying drawings.

Figure 2:
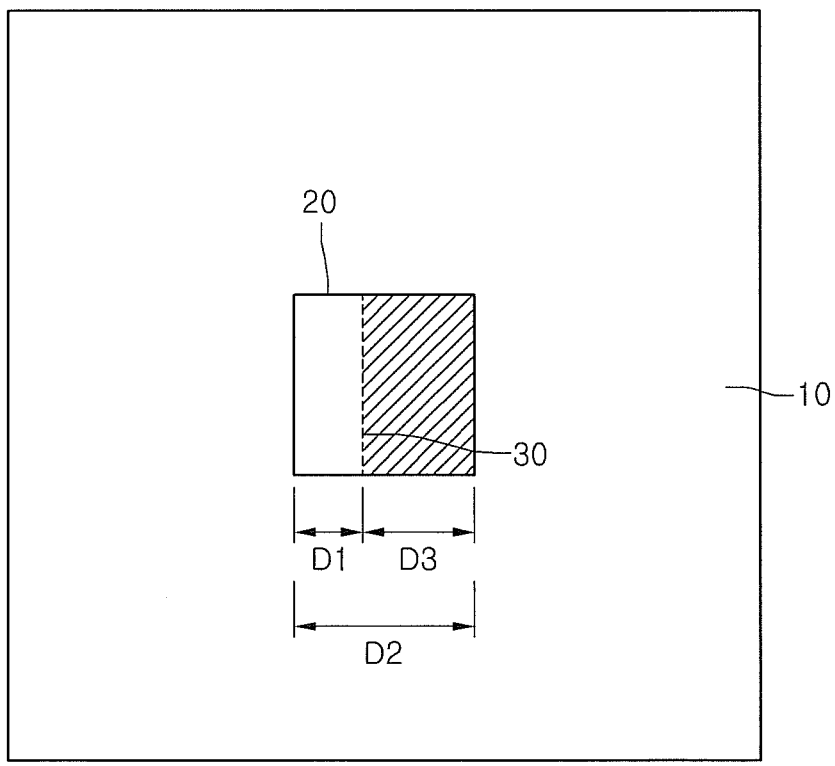
FIG. 2 is a plan view of FIG. 1.

FIG. 1 is a side-sectional view of an electrode structure on a compound semiconductor layer according to a first embodiment, and FIG. 2 is a plan view of FIG. 1.

Referring to FIG. 1, an electrode 20 and a light guide layer 30 is disposed on a compound semiconductor layer 10. The compound semiconductor layer 10 includes a compound semiconductor, e.g., a Group III-V compound semiconductor, and may be formed a semiconductor material having a compositional formula of $In_xAl_yGa_{1-x-y}N$ ($0 \leq x \leq 1$, $0 \leq y \leq 1$, $0 \leq x+y \leq 1$). For example, the compound semiconductor layer 10 may be formed of at least one selected from the group consisting of GaN, AlN, AlGaN, InGaN, InN, InAlGaN, AlInN, AlGaAs, GaP, GaAs, GaAsP, and AlGaInP.

The compound semiconductor layer 10 may be an N-type semiconductor layer doped with an N-type dopant. The N-type dopant may include N-type dopants such as Si, Ge, Sn, Se, and Te. The compound semiconductor layer 10 may be a P-type semiconductor layer doped with a P-type dopant. The P-type dopant may include P-type dopants such as Mg, Zn, Ca, Sr, and Ba. The compound semiconductor layer 10 may be an undoped semiconductor layer. The undoped semiconductor layer may be a low conductive layer with respect to the n-type semiconductor.

The compound semiconductor layer 10 may have a single- or multi-layered structure. Also, the compound semiconductor layer 10 may include a light emitting structure layer. For example, the compound semiconductor layer 10 may have a structure in which an N-type semiconductor layer, an active layer, and a P-type semiconductor layer are stacked in order from an upper layer, or a structure in which an N-type semiconductor layer, an active layer, a P-type semiconductor layer, and an N-type semiconductor layer are stacked in order from an upper layer.

The electrode 20 may be a pad or an electrode having an arm or branch shape and connected to the pad. The electrode 20 may have a single- or multi-layered structure and be formed of one of Cr, Ti, Al, In, Ta, Pd, Co, Ni, Si, Ge, Ag, Cu, and Au or combinations thereof. The electrode 20 may be formed of one of the foregoing materials in consideration of an ohmic contact, an adhesion, a reflective characteristic, and a conductive characteristic with respect to the compound semiconductor layer 20.

When the electrode 20 is the pad, one or plurality of pads may be provided. The plurality of pads may be electrically connected to each other. When viewed from a top side, the electrode 20 may have one shape or mixed shape of a bar shape, a fold line shape, a shape having at least one curved surface, a polygonal shape, a mixed shape of a curved surface and a polygonal shape, a matrix shape, and a shape having an arm.

The electrode 20 having the arm or branch shape may have one of a circular shape, a polygonal shape, and a mixed shape of a curved surface and an aspheric surface, but is not limited thereto.

The electrode 20 includes a lower portion and an upper portion 22. The lower portion 21 contacts a top surface of the compound semiconductor layer 10, and the upper portion 22 may have a top surface having an area greater than a lower surface of the lower portion 21 on the lower portion 21. In this case, the upper portion 22 covers a top surface of the light guide layer 30.

The upper portion 22 of the electrode 20 has a width D2 greater than a width D1 of the lower surface on the lower portion 21. That is, the electrode 20 has a top surface width (or area) greater than a lower surface width (or area). Here, the widths D1, D2, and D3 may be widths or lengths in the same direction.

In the light guide layer 30, an area of inner surfaces S1 and S3 contacting the electrode 20 may be greater by about 30% or more than an area (or size) of an opened outer surface S2 non-contacting the electrode 20.

The light guide layer 30 is disposed between a portion of the electrode 20 and the compound semiconductor layer 10. The light guide layer 30 is disposed within a region of the electrode 20 and overlaps the electrode 20. Referring to FIG. 2, the light guide layer 30 disposed under the region of the electrode 20 is expressed as diagonal lines. The electrode 20 has at least three outer side surfaces non-contacting the electrode 20.

Referring to FIGS. 1 and 2, at least one inner surface of the light guide layer 30 contacts at least one portion of the lower portion 21 of the electrode 20 and a portion of the outer side surfaces may be exposed to the outside.

The light guide layer 30 has a second surface S2 disposed at a side opposite to the first, second, and third surfaces S1, S2, and S3 contacting the lower portion of the electrode 20 and non-contacting the compound semiconductor layer 10 and a forth surface S4 contacting the top surface of the compound semiconductor layer 10.

The second surface S2 of the light guide layer 30 may be a surface opposite to the first surface S or a non-contact opened surface exposed to the outside. Thus, light may be emitted from the second surface S2. The second surface S2 of the light guide layer 30 may be disposed on at least one surface of the electrode 20, e.g., a first side surface, a second side surface, a third side surface, or all side surfaces. Thus, the second surface S2 of the light guide layer 30 may be one side surface or more or three side surfaces as shown in FIG. 2.

The third surface S3 of the light guide layer 30 may contact the lower surface of the upper portion 22 of the electrode 20. The third surface S3 of the light guide layer 30 may be formed parallel to the top surface of the electrode 20.

At least one side surface of the second surface S2 of the light guide layer 30 may protrude from a side surface of the electrode 20 and has a distance of about 1 μm to about 10 μm. The second surface S3 of the light guide layer 30 may have at least one of an inclined surface, a curved surface, and a flat surface. The second surface S2 of the light guide layer 30 may have an area greater or less than that of the first surface S1.

Here, the inner surfaces S1 and S3 contacting the electrode 20 of a periphery of the light guide layer 30 may have areas less than or greater than that of the outer surface S2 non-contacting the electrode 20.

The lower surface S4 of the light guide layer 30 may have a flat or uneven surface.

The light guide layer 30 may be formed of a transmittive material such as nitride or oxide or a reflective metal containing Ag. The oxide may include one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, $SiO_2$, $SiO_x$, $Al_2O_3$, and $TiO_x$, and the nitride may include one of IZO Nitride (IZON), $SiO_xN_y$, and $Si_3N_4$. Since light is transmitted through the transmittive oxide and nitride, a portion of light incident through the compound semiconductor layer 10 may be refracted or transmitted. Also, the reflective metal containing Ag may reflect light incident into an interface with the compound semiconductor layer 10 in a different direction to absorb the light or change a critical angle of the light. In the current embodiment, a structure guiding light into the inside or guiding the light reflection may be defined as the light guide layer 30.

The light guide layer 30 may be disposed between the upper portion 22 of the electrode 20 and the compound semiconductor layer 10 to reduce a contact area between the electrode 20 and the compound semiconductor layer 10, thereby extracting light incident into the compound semiconductor layer 10 through the light guide layer 30.

Here, current injection efficiency of the electrode 20 is not increased in proportion to the contact area between the electrode 20 and the compound semiconductor layer 10. For example, as the contact area is increased in a specific region, the current injection efficiency or internal quantum efficiency is not increased in proportion to the contact area. Also, when the contact area of the electrode 20 is unnecessarily increased, light extraction efficiency may be reduced. The current injection efficiency of the electrode 20 is further affected by a state in which electrode patterns are distributed.

The electrode 20 contacts a surface of the compound semiconductor layer 10, e.g., an N-face. The lower portion 21 of the electrode 20 may have at least one side contacting the compound semiconductor layer 10 with a width D1 of less than about 1 μm to about 3 μm. The width D1 may be a width of the lower surface of the electrode 20 or a width contacting the semiconductor layer. The width D1 of the lower surface of the electrode 20 may be about 10% to about 90% of a width D2 of one side of the top surface. The electrode 20 may have a thickness of less than about several μm, e.g., less than 5 μm, but is not limited thereto. Although the top surface of the compound semiconductor layer 10 contacting the electrode 20 was described as the N-face, the top surface of the compound semiconductor layer 10 may be a Ga-face. Here, the electrode 20 contacts the Ga-face.

A ratio (D1:D3) of the width D1 of the lower surface of the electrode 20 to a width D3 of the light guide layer 30 may be about 1:9 to about 9:1. As the width D3 of the light guide layer 30 is increased, light absorption by the lower portion 21 may be reduced to improve the light extraction efficiency. Here, when a pattern width of the electrode 20 is simply narrowed, an operation voltage may be increased. Here, the width D1 of the lower surface of the electrode 20 may be set in consideration of the operation voltage and the current injection efficiency.

Also, the width D1 of the lower surface of the electrode 20 may be about 1/9 to about 9/9 of the width D3 of one side of the light guide layer 30. Alternatively, the width D3 of the light guide layer 30 may be about 1/9 to about 9/9 of the width D1 of the lower surface of the electrode 20.

Referring to FIGS. 1 and 2, when viewed from a top side of a chip, the width D2 of the electrode 20, i.e., a line width Dl of the electrode 20 may be less than about several tens μm. The light guide layer 30 may be parallel to the lower portion of the electrode 20 in a shape in which the light guide layer 30 does not protrude to the outside of the electrode 20. The light guide layer 30 may have a thickness less than that of the electrode 20. An outer surface of the light guide layer 30 is flush with at least one side surface of the electrode 20.

Since a lower portion of a side of the electrode 20 overlaps the light guide layer 30, a portion of light proceeding from the inside of the compound semiconductor layer 10 to the surface of the compound semiconductor layer 10 may be extracted to the outside through the light guide layer 30 or reflected into the compound semiconductor layer 10. The light guide layer 30 prevents light from being absorbed by the electrode 20 or guides light to extract the light to the outside.

The electrode structure according to an embodiment includes the electrode 20 and the light guide layer 30 contacting the top surface of the compound semiconductor layer 10. The top surface S3 or lower surface S4 of the light guide layer 30 may have an area, which is about 10% to about 90% of an area of the top surface of the electrode 20.

Also, the light guide layer 30 may buffer an external impact due to bonding applied to a portion of electrode 20.

Figure 3:
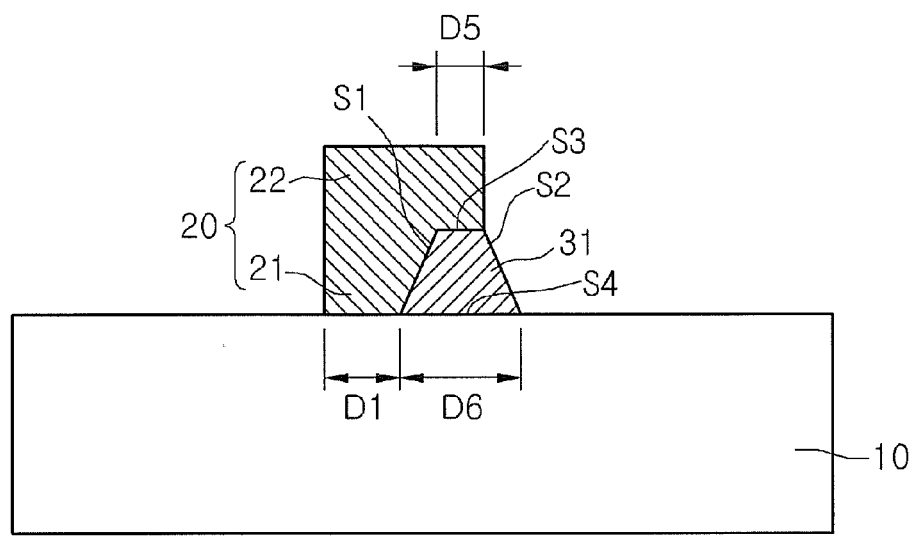
FIG. 3 is a side-sectional view of an electrode structure on a compound semiconductor layer according to a second embodiment.

FIG. 3 is a side-sectional view of an electrode structure on a semiconductor layer according to a second embodiment. In descriptions of the second embodiment, the same part as that of the first embodiment will be described with reference to the first embodiment, and their duplicated descriptions will be omitted.

Referring to FIG. 3, an electrode 20 is disposed on a compound semiconductor layer 10. A light guide layer 31 is disposed between the compound semiconductor layer 10 and the electrode 20. The light guide layer 31 has a width D6 (or an area) of a lower surface S4 greater than that D5 (or area) of a top surface S3. For example, the light guide layer 31 may have a polygonal shape such as a trapezoid shape.

Since the width D6 of the lower surface of the light guide layer 31 is further widened, an incident area may be increased. Thus, light extraction efficiency by the light guide layer 31 may be increased.

Since an outer side surface S3 of the light guide layer 30 has an area greater than that of FIG. 1, the light extraction efficiency may be improved. Also, a portion of an outer side surface S2 of the light guide layer 31 may protrude from a side surface of the electrode 20.

Figure 4:
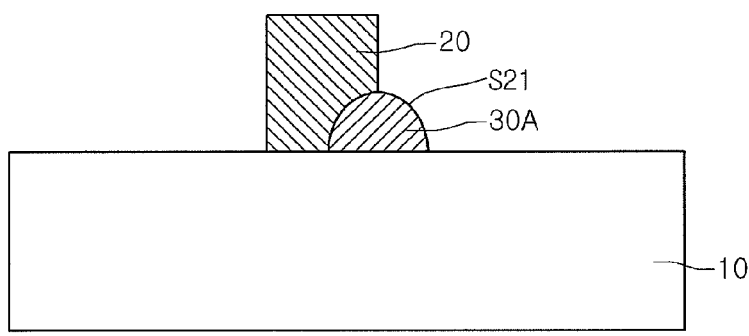
FIG. 4 is a side-sectional view of an electrode structure on a compound semiconductor layer according to a third embodiment.

FIG. 4 is a side-sectional view of an electrode structure on a semiconductor layer according to a third embodiment. The third embodiment will be described with reference to the first embodiment.

Referring to FIG. 4, a light guide layer 30A has a convex lens shape or a hemisphere shape. The light guide layer 30A may be formed of a transmittive material such as oxide or nitride. This refers to the first embodiment.

The light guide layer 30A contacts a top surface of a compound semiconductor layer 10. A contact ratio of the light guide layer 30A and the compound semiconductor layer 10 refers to the first embodiment. Also, an outer spherical surface S21 of the light guide layer 30A may have a wide surface area and a convex lens shape to improve a light extraction area.

An inside part of the light guide layer 30A overlaps under an electrode 20, and an outside part protrudes from the electrode 20. Thus, light incident through the compound semiconductor layer 10 may be emitted through the spherical surface S21 having the lens shape. The light guide layer 30A may have the hemisphere shape to further buffer an external impact due to bonding.

A plurality of light guide layers 30A may be disposed under the electrode 20. The plurality of guide layer 30A may be disposed on both lower sides of the electrode 30, but is not limited thereto.

Figure 5:
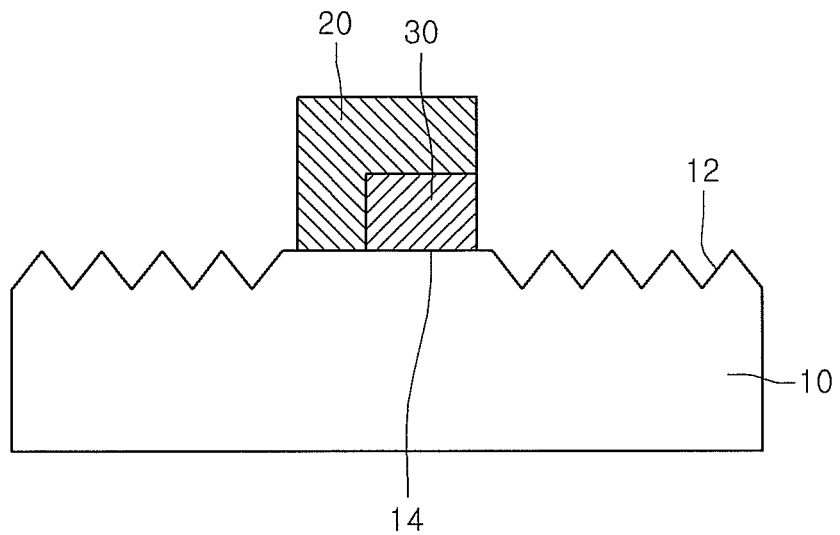
FIG. 5 is a side-sectional view of an electrode structure on a compound semiconductor layer according to a fourth embodiment.

FIG. 5 illustrates a forth embodiment.

Referring to FIG. 5, a roughness 12 is disposed at a top surface of a compound semiconductor layer 10. The compound semiconductor layer 10 may be formed of a nitride-based material, and a top surface of the compound semiconductor layer 10 may be an N-face. The roughness 12 may be formed into an uneven pattern having a triangular shape. The roughness 12 may improve light extraction efficiency.

A portion of the top surface of the compound semiconductor layer 10 may have a flat surface 14. A light guide layer 30 or/and an electrode 20 may be disposed on the flat surface 14.

An interface between the compound semiconductor layer 10 and the electrode 20 may have a rough surface to prevent light from being absorbed. For example, when the light guide layer 30 is formed of a transmittive material, the top surface of the compound semiconductor layer 10 may be flat or rough for incident light. Alternatively, when the light guide layer 30 is formed of a reflective material, the top surface of the compound semiconductor layer 10 may be rough for emitting light. In this case, a critical angle of light may be changed.

That is, an interface between the light guide layer 20 and the compound semiconductor layer 10 may be flat or rough for light transmission or reflection.

Figure 6:
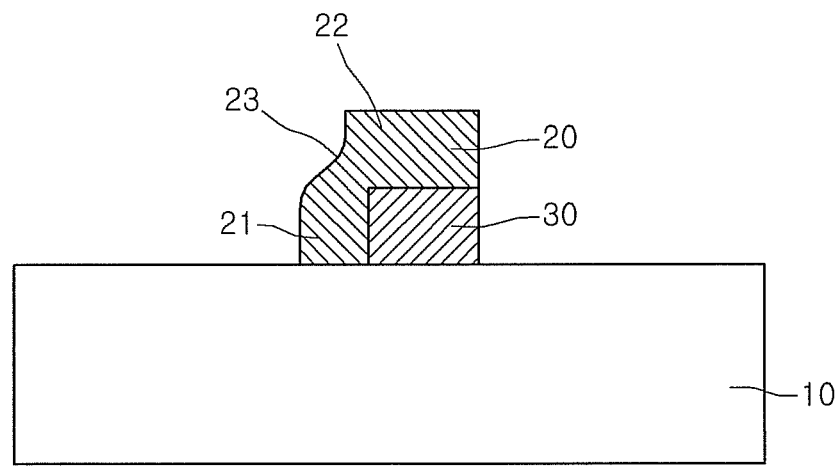
FIG. 6 is a side-sectional view of an electrode structure on a compound semiconductor layer according to a fifth embodiment.

FIG. 6 illustrates a fifth embodiment.

Referring to FIG. 6, an electrode 20 of a compound semiconductor layer 20 includes a bent part 23 between a lower portion 21 and an upper portion 22. The bent part 23 of the electrode 20 is disposed at a side opposite to that of a light guide layer 30. The bent part 23 is bent from a lower surface of the electrode 20 to extend up to a top surface of the electrode 20. The bent part 23 may have a structure in which a side surface between the lower surface and the top surface of the electrode 20 is stepped.

Figure 7:
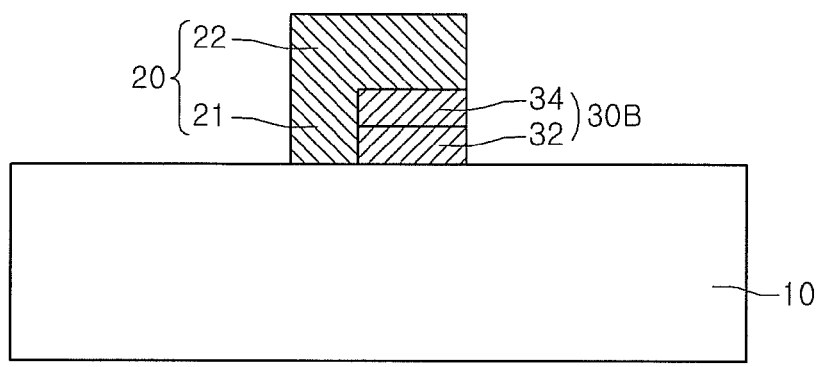
FIG. 7 is a side-sectional view of an electrode structure on a compound semiconductor layer according to a sixth embodiment.

FIG. 7 illustrates a sixth embodiment.

Referring to FIG. 7, a light guide layer 30B having a multi-layered structure is disposed between an electrode 20 and a compound semiconductor layer 10. A portion of the electrode 20 overlaps above the light guide layer 30B. The electrode 20 may be an electrode having a pad or arm shape. The light guide layer 30B may be formed of a transmittive material or/and a reflective material to improve light extraction efficiency through light transmission or/and reflection.

The light guide layer 30B has a multi-layered structure. A first layer 32 may be disposed on the compound semiconductor layer 10 to guide incident light, and a second layer 34 may be disposed on the first layer 32 to transmit or reflect the light incident through the first layer 32. The first and second layers 32 and 34 may have the same width and thickness as each other or widths and thicknesses different from each other.

The first layer 32 may be formed of transmittive oxide, e.g., one of ITO, IZO, IZTO, IAZO, IGZO, IGTO, AZO, ATO, and GZO. The second layer 34 may be formed of an insulation material, e.g., one of ZnO, $SiO_2$, $SiO_x$, and $Al_2O_3$.

Alternatively, the first layer 32 may be a material layer having a first refractive index n1 less than that of a nitride semiconductor layer, and the second layer 34 may be a material layer having a second refractive index n2 less than the first refractive index n1. For example, the first layer 32 may be formed of ITO, and the second layer 34 may be formed of $SiO_2$. Thus, light emitted through the compound semiconductor layer 10 may be extracted to the outside through the first layer 32 and the second layer 34. Alternatively, the second layer 34 of the light guide layer 30B may be formed of a reflective material. The reflective material may be a metal containing Al or Ag to reflect light incident through the first layer 32.

Figure 8:
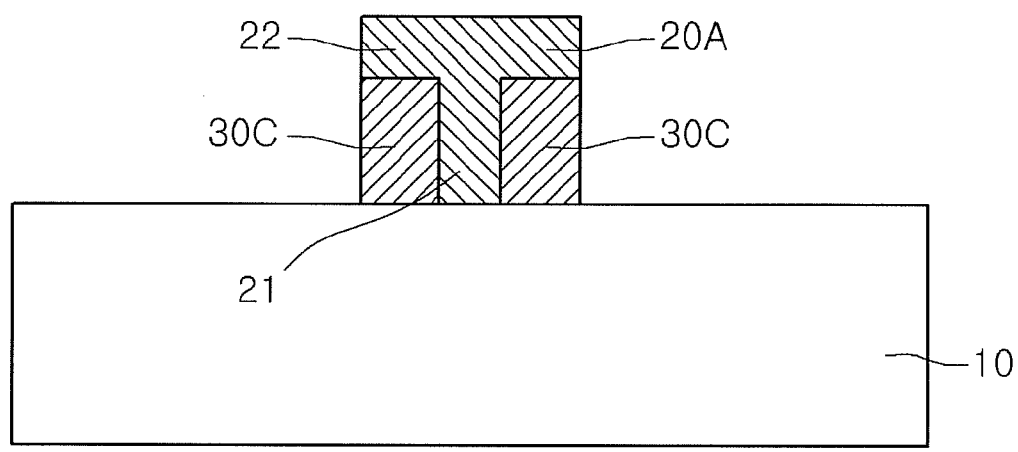
FIGS. 8 to 10 are side-sectional views of an electrode structure on a compound semiconductor layer according to a seventh embodiment.
Figure 9:
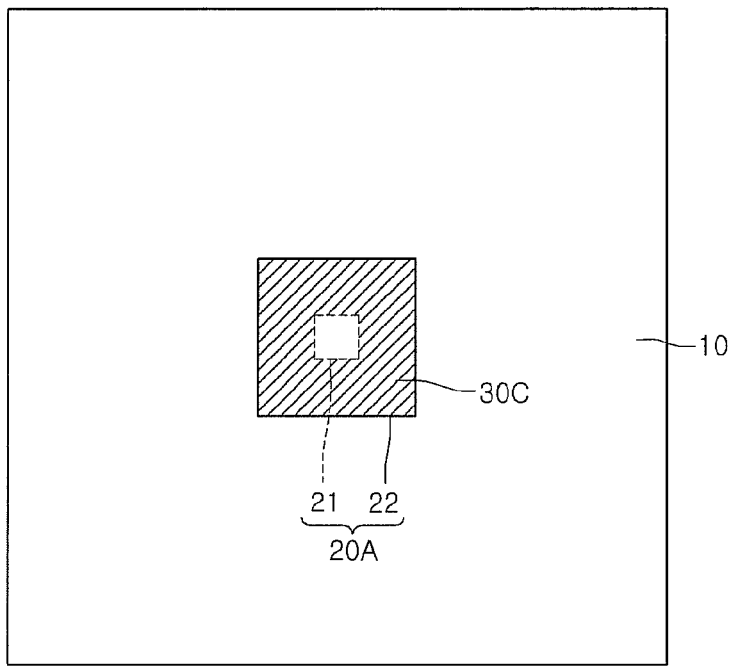
Figure 10:
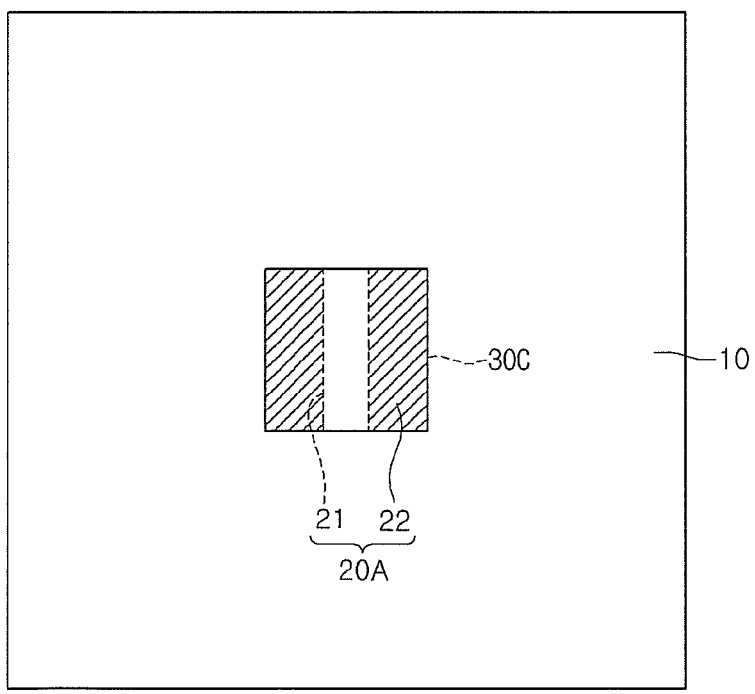

FIGS. 8 to 10 illustrate a seventh embodiment.

Referring to FIGS. 8 to 10, an electrode may be disposed on a compound semiconductor layer 10, and a light guide layer 30C may be disposed around a lower portion 21 of the electrode 20A.

The lower portion 21 of the electrode 20A may contact the compound semiconductor layer 10 through the inside of the light guide layer 30C. An upper portion 22 of the electrode 20A is disposed on the light guide layer 30C. The light guide layer 30C may be disposed on both side surfaces of the lower portion 21 of the electrode 20A or on all of side surfaces. When the light guide layer 30C is disposed around the lower portion 21 of the electrode 20A, a structure of FIG. 9 may be realized. When the light guide layer 30C is disposed on both sides of the lower portion 21 of the electrode 20A, a structure of FIG. 10 may be realized.

Here, an inner surface area contacting the electrode 20A of a periphery of the light guide layer 30C may be less than an outer surface area non-contacting the electrode 20A.

The lower portion 21 of the electrode 20A contacts the compound semiconductor layer 10 through the light guide layer 30C, and the upper portion 22 is disposed on the light guide layer 30C. That is, the electrode 20A may have a "T" shape in section. Also, an outer side of the light guide layer 30C may have a circular or polygonal shape.

Figure 11:
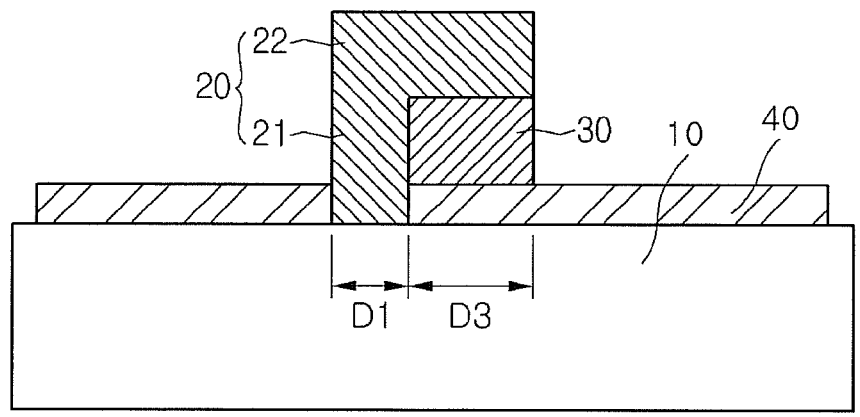
FIG. 11 is a side-sectional view of an electrode structure on a compound semiconductor layer according to an eighth embodiment.

FIG. 11 illustrates an eighth embodiment.

Referring to FIG. 11, an electrode layer 40 is disposed on a compound semiconductor layer 10. The electrode layer 40 may include a transmittive conductive layer. The electrode layer 40 may have a thickness of several hundreds Å or more. The electrode layer 40 may be formed of one of ITO, IZO, IZON, IZTO, IAZO, IGZO, IGTO, AZO, ATO, and GZO.

A light guide layer 30 is disposed on the electrode layer 40. The light guide layer 30 may be formed of one of ITO, IZO, IZON, IZTO, IAZO, IGZO, IGTO, AZO, ATO, GZO, ZnO, $SiO_2$, $SiO_x$, $Al_2O_3$, $TiO_x$, $SiO_xN_y$, $Si_3N_4$, and a reflective metal containing Ag. The light guide layer 30 may be formed of the same material as the electrode layer 40 or a material different from that of the electrode layer 40.

A portion of the electrode 20 is disposed on the light guide layer 30. A lower portion 21 of the electrode 20 surface-contacts a top surface of the compound semiconductor layer 10 through the inside of the electrode layer 40. Also, the lower portion 21 of the electrode 20 may contact an inner side surface of the electrode layer 40. Also, a portion of the electrode 20 may further extend up to a top surface of the electrode layer 40. The electrode layer 40 diffuses a current into an entire region.

An upper portion 22 of the electrode 20 is disposed on the lower portion 21 and the light guide layer 30C.

The electrode layer 40 may cover about 60% to about 95% of the top surface of the compound semiconductor layer 10, but is not limited thereto.

Light emitted from the compound semiconductor layer 10 may be extracted through the electrode layer 40 and the light guide layer 30.

FIGS. 12 to 21 illustrate a ninth embodiment and a modified example of an electrode.

Figure 12:
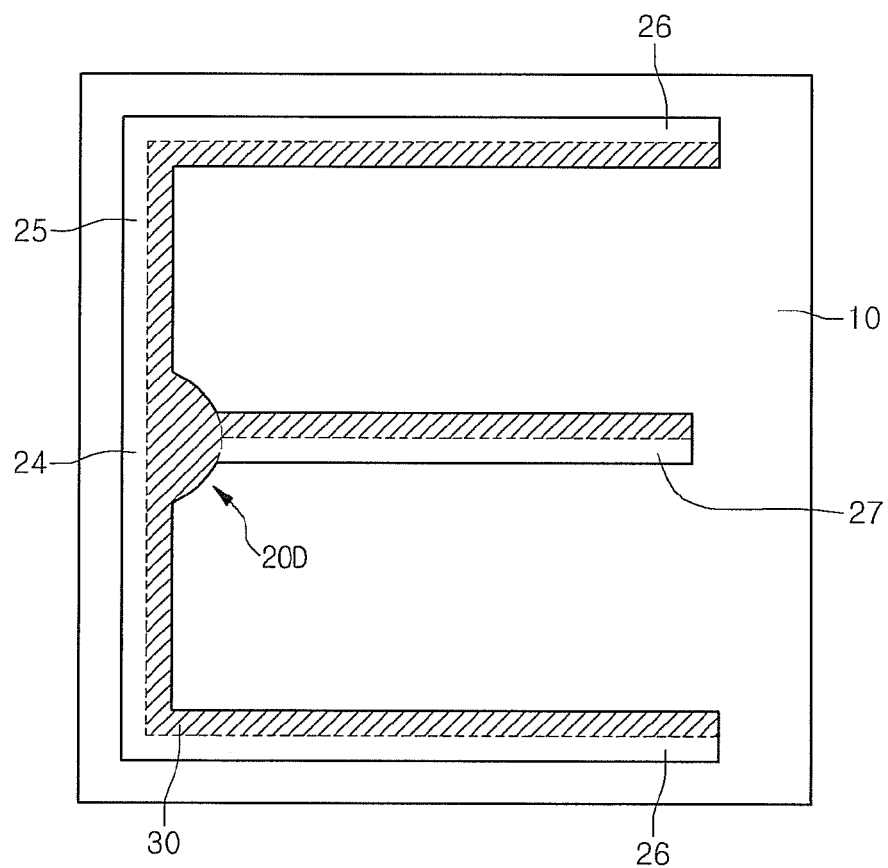
FIGS. 12 to 21 are plan views of an electrode structure on a compound semiconductor layer according to a ninth embodiment.

Referring to FIG. 12, an electrode 20D including a plurality of arm parts 25, 26, and 27 and a light guide layer 30 overlapping under portions of the arm parts 25, 26, and 27 are disposed on a compound semiconductor layer 10.

A pad part 24 is disposed on the electrode 20D. The plurality of arm parts 25, 26, and 27 is branched from the pad part 24 in center and side directions.

A light guide layer 30 (diagonal line region) is disposed under the pad part 24 of the electrode 20D and the plurality of arm parts 25, 26, and 27. The light guide layer 30 may be disposed between the electrode 20D and the compound semiconductor layer 10 to reduce a contact area between the electrode 20D and the compound semiconductor layer 10.

When views from a top side of the device, the light guide layer 30 may be about 10% to about 90% of an area of a top surface of the electrode 20D. Alternatively, a contact area between the light guide layer 30 and the electrode 20D may be about 10% to about 90% of that between the electrode 20D and the compound semiconductor layer 10. Thus, the light guide layer 30 may prevent light from being absorbed by the electrode to improve light extraction efficiency.

Since the light guide layer 30 reduces the contact area between the compound semiconductor layer 10 and the electrode 20D, the light extraction efficiency through a surface of the compound semiconductor layer 10 may be improved.

Figure 13:
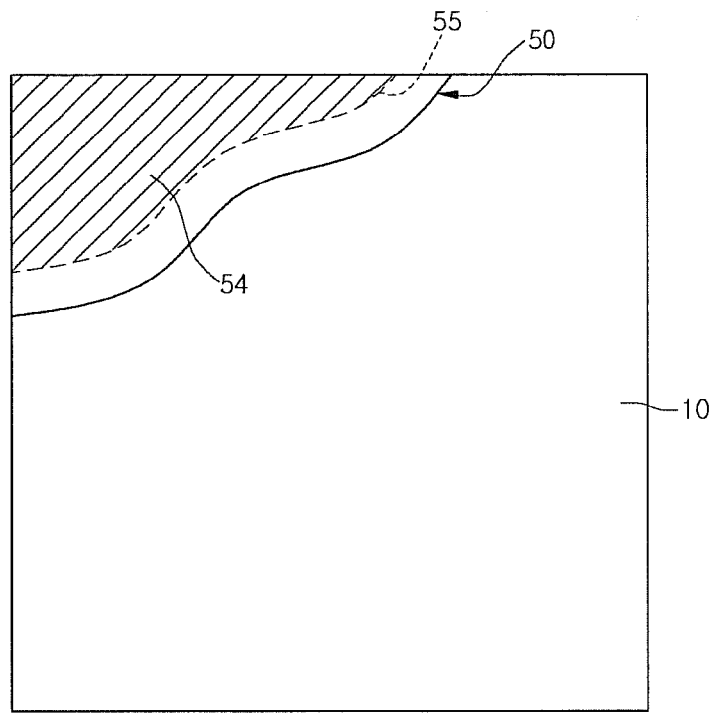

Referring to FIG. 13, an electrode 50 is disposed on a portion of an edge of the compound semiconductor layer 10. The electrode 50 includes a pad part 54. The electrode 50 may have a side surface inwardly bent from an edge region.

A light guide layer 55 is disposed under the electrode 50. The light guide layer 55 is disposed under the inside or/and outside of the electrode 50. The light guide layer 55 effectively guides light emitted from the compound semiconductor layer 10.

Figure 14:
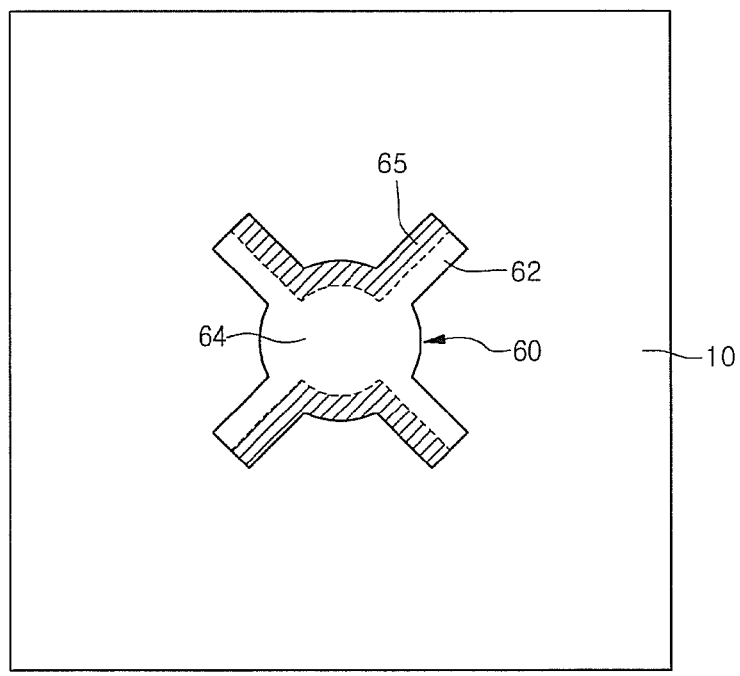

Referring to FIG. 14, an electrode 60 includes a plurality of arm parts 62 radially branched from a pad part 64. A light guide layer 65 has an opened surface under one side and the other side of the electrode 60 and extracts a portion of light incident into the electrode 60 to the outside.

Figure 15:
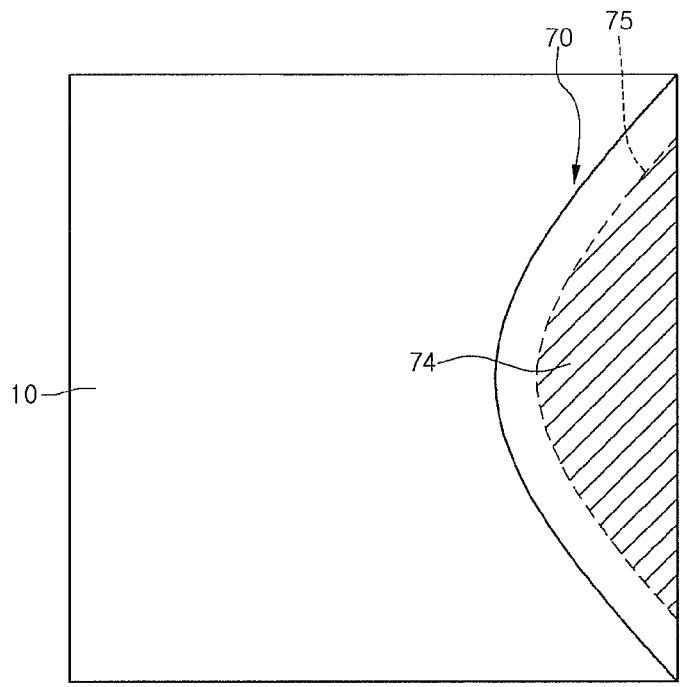

Referring to FIG. 15, an electrode 70 has a hemisphere shape and a predetermined curvature with respect to a pad part 74. The electrode 70 extends up to an edge portion of a compound semiconductor layer 10. A light guide layer 75 is disposed under the electrode 70. An area of a top surface of the light guide layer 75 may be about 10% to about 90% of that of a top surface of the electrode 70. Thus, the light guide layer 75 may prevent light from being absorbed by the electrode 70 to improve light extraction efficiency.

The electrode 70 may uniformly contact the compound semiconductor layer 10 with a contact area of about 10% to about 90%.

Figure 16:
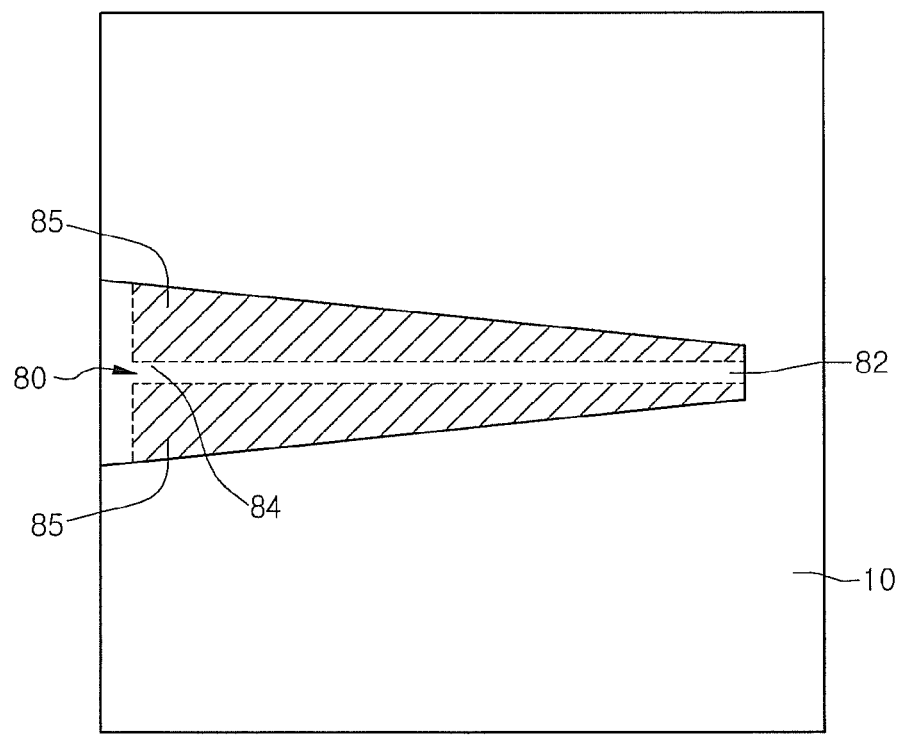

Referring to FIG. 16, when viewed from a top side, an electrode 80 has a polygonal shape such as a trapezoid shape. One side having a wide area of the electrode 80 may be disposed in an edge region and used as a pad part 84, and the other side may be used as an arm part 82. A light guide layer 85 may be disposed under both sides of the electrode 80. A top surface of the light guide layer 85 may be about 10% to about 90% of that of the electrode 80. A lower portion of the electrode 80 may be disposed between the light guide layers 85 or along a side of the light guide layer 85.

Figure 17:
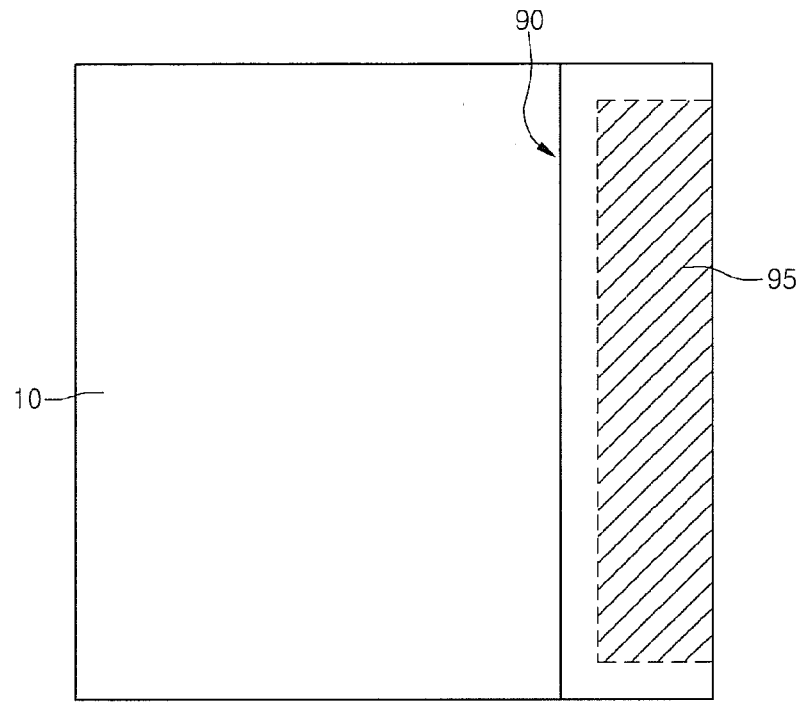

Referring to FIG. 17, when viewed from a top side, an electrode 90 has a length corresponding to one side of a compound semiconductor layer 10 and a predetermined width. A light guide layer 95 partially overlaps under the outside of the electrode 90. A top surface of the light guide layer 95 may be about 10% to about 90% of that of the electrode 90.

The electrode 90 has a width gradually narrowed from one side to the other side. The light guide layer 95 may be disposed on both outer sides of the electrode 90 and have a width gradually narrowed toward the other side. Here, the electrode 90 may contact the compound semiconductor layer 10 with a constant width regardless of a variation of the width of the light guide layer 95. This may be changed according to embodiments.

Figure 18:
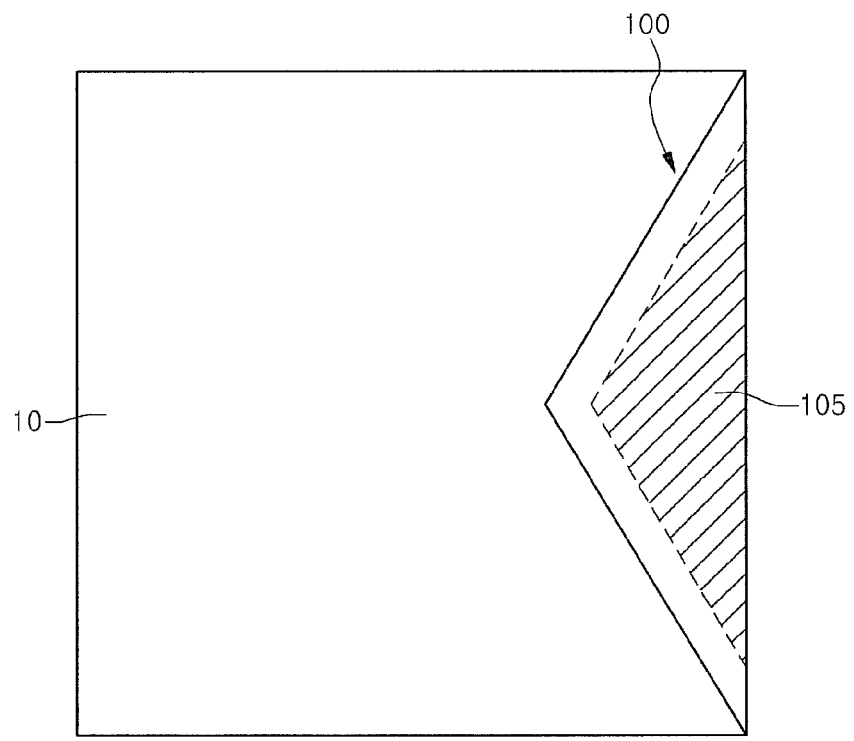

Referring to FIG. 18, when viewed from a top side, an electrode 100 has a triangular shape. A light guide layer 105 partially overlaps under a side of the electrode 100. A lower portion of the electrode 100 contact a top surface of a compound semiconductor layer 10 with a constant width.

Figure 19:
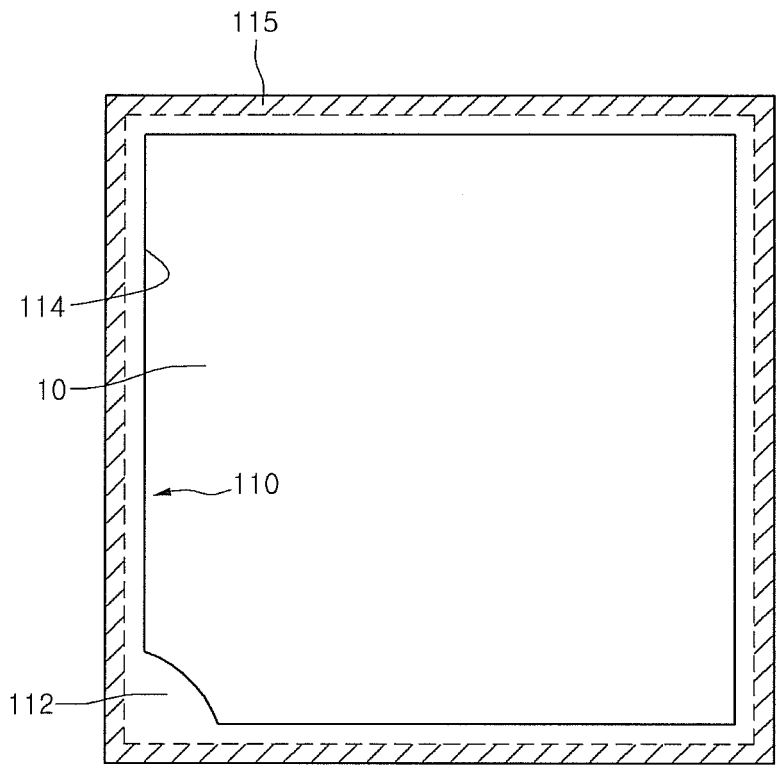

Referring to FIG. 19, an electrode 110 includes an arm part 114 having a closed or opened loop shape along a periphery of a top surface of a compound semiconductor layer 10 and a pad part 112 disposed at least one corner. A light guide layer 115 is disposed under a side of the electrode 110. The light guide layer 115 may partially overlap a portion of the arm part 114.

Figure 20:
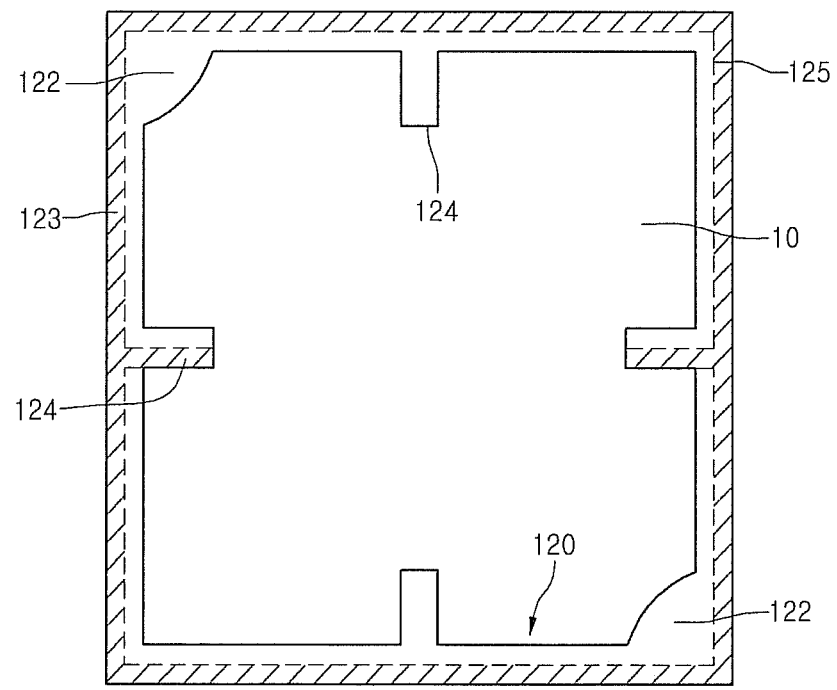

Referring to FIG. 20, an electrode 120 includes a side arm part 123 having a closed or opened loop shape along a periphery of a top surface of a compound semiconductor layer 10, an inner arm part 124 branched from the side arm part 123 in an inward direction, and a pad part 122 disposed at least one corner.

A light guide layer 125 is disposed under the outside of the electrode 120. The light guide layer 125 may partially overlap along portions of the side arm 123 and the inner arm 125. A region overlapping between the light guide layer 125 and the electrode 120 may be changed according to light extraction efficiency.

Figure 21:
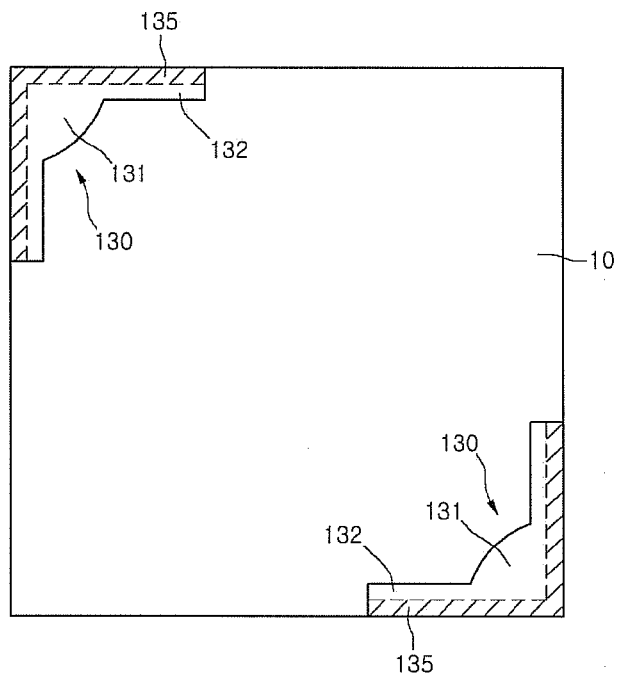

Referring to FIG. 21, an electrode 130 is disposed on at least both corners. The electrode 130 includes an arm part 132 and a pad 131. The light guide layer 135 overlaps under a portion of the outside of the electrode 130.

Figure 22:
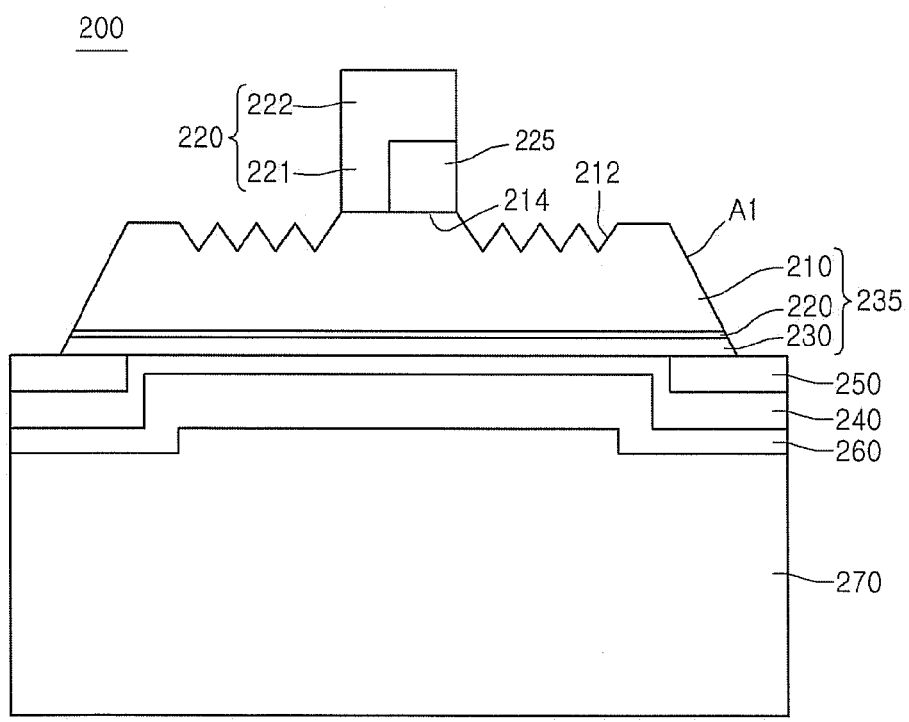
FIG. 22 is a side-sectional view of a light emitting device according to a tenth embodiment.

FIG. 22 is a side-sectional view of a light emitting device according to a tenth embodiment. In descriptions of the tenth embodiment, the structures of the electrode and the light guide layers according to the above-described embodiments may be selectively applicable.

Referring to FIG. 22, a light emitting device includes a light emitting structure layer 235, an electrode 220, a light guide layer 225, a first conductive layer 240, a passivation layer 250, a second conductive layer 260, and a support member 270.

The light emitting structure layer may be formed of a Group II to VI compound semiconductor, e.g., Group III-V compound semiconductor. For example, the light emitting structure layer 235 may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the light emitting structure layer 235 may be formed of at least one selected from the group consisting of GaN, AlN, AlGaN, InGaN, InN, InAlGaN, AlInN, AlGaAs, GaP, GaAs, GaAsP, and AlGaInP.

The light emitting structure layer 235 includes a first conductive type semiconductor layer 210, an active layer 220, and a second conductive type semiconductor layer 230. The active layer 220 is disposed between the first conductive type semiconductor layer 210 and the second conductive type semiconductor layer 230. The light emitting structure layer 235 may include a third semiconductor layer having a polarity opposite to that of a second conductive type under the second conductive type semiconductor layer 230. The light emitting structure layer 235 may be defined as disclosed in the first to ninth embodiments.

The first conductive type semiconductor layer 210 may be realized by at least one semiconductor layer doped with a first conductive type dopant. For example, the semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 210 may be formed of at least one selected from the group consisting of GaN, AlN, AlGaN, InGaN, InN, InAlGaN, AlInN, AlGaAs, GaP, GaAs, GaAsP, and AlGaInP.

When the first conductive type semiconductor layer 210 is an N-type semiconductor layer, the first conductive type dopant is an N-type dopant. The N-type dopant may include Si, Ge, Sn, Se, and Te.

An electrode 220 is disposed on a top surface of the first conductive type semiconductor layer 210. A roughness 212 may be disposed on a portion of the top surface or the entire surface of the first conductive type semiconductor layer 210. Another semiconductor layer, e.g., an undoped semiconductor layer or a low conductive semiconductor layer, which has a dopant concentration less than that of the first conductive type semiconductor layer 210, may be disposed between the electrode 220 and the first conductive type semiconductor layer 210.

The top surface of the first conductive type semiconductor layer 210 may be an N-face surface. The electrode 220 contacts the top surface of the first conductive type semiconductor layer 210. The electrode 220 ohmic-contacts and a portion of the electrode 220 may be used as a bonding pad. The electrode 220 may have a single- or multi-layered structure. An arm electrode having a line width may be electrically connected to the electrode 220.

A contact area between the electrode 220 and the first conductive type semiconductor layer 210 may be about 10% to about 90% of an area of a top surface of the electrode 220.

The electrode 220 may have a single- or multi-layered structure and be formed of one of Cr, Ti, Al, In, Ta, Pd, Co, Ni, Si, Ge, Ag, Cu, and Au or combinations thereof. The electrode 220 may be formed of one of the foregoing materials in consideration of an ohmic contact, an adhesion, a reflective characteristic, and a conductive characteristic with respect to the first conductive type semiconductor layer 210.

When the electrode 220 is the pad, one or plurality of pads may be provided. The plurality of pads may be electrically connected to each other. When viewed from a top side, for example, an arm structure of the electrode 220 includes a linear arm structure, a curved arm structure, a mixed structure of the linear arm structure and the curved arm structure, an arm structure branching from one arm structure, a polygonal arm structure, a lattice arm structure, a dot arm structure, a lozenge arm structure, a parallelogram arm structure, a mesh arm structure, a stripe arm structure, a cross arm structure, a radial arm structure, a circular arm structure, and a mixed arm structure thereof, but is not limited thereto. The electrode 220 having such an arm structure may smoothly supply a power to the semiconductor layer to prevent current from being concentrated onto one spot.

The electrode 220 includes a lower portion 221 and an upper portion. The lower portion 221 contacts the top surface of the first conductive type semiconductor layer 210. The upper portion 222 is disposed on the lower portion 21 and the light guide layer 225.

The upper portion 222 may have a width greater than that of the lower portion 221 on the lower portion 221. That is, the electrode 220 has a top surface greater by at least one and half than a lower surface thereof.

The light guide layer 225 is disposed between the electrode 220 and the first conductive type semiconductor layer 210. The light guide layer 225 may be formed of a transmittive material such as nitride or oxide or a reflective metal containing Ag. The oxide may include one of ITO, IZO, IZON, IZTO, IAZO, IGZO, IGTO, AZO, ATO, GZO, ZnO, $SiO_2$, $SiO_x$, $Al_2O_3$, and $TiO_X$ or the nitride may include one of $SiO_xN_y$, and $Si_3N_4$. Since the oxide and nitride may be defined as transmittive structures, the oxide and nitride may guide incident light to the inside to extract the light. Also, the reflective material reflects the light from an interface with the first conductive type semiconductor layer 210 in a different direction to prevent the light from being absorbed.

The first conductive type semiconductor layer 225 contacts a lower surface of the light guide layer 225. A portion of a side surface of the light guide layer 225 contacts an inner side surface of the electrode 220, and a portion of the side surface is exposed to the outside.

The light guide layer 225 is disposed between the electrode 220 and the first conductive type semiconductor layer 210 to reduce a contact area between the electrode 220 and the first conductive type semiconductor layer 210.

Here, the contact area between the electrode 220 and the first conductive type semiconductor layer 210 determines current injection efficiency. Since the current injection efficiency is not increased in proportion to the contact area between the electrode 220 and the first conductive type semiconductor layer 210, the increase of the contact area acts as a factor, which interrupts current extraction efficiency. Thus, the electrode 220 contacts the first conductive type semiconductor layer 210 within a range in which the current injection efficiency does not influence on the contact area between the electrode 220 and the first conductive type semiconductor layer 210. The light guide layer 225 may be disposed in a region except the contact region. Here, the light guide layer 225 may be disposed in consideration of an adhesion of the electrode 220 and the current injection efficiency. The structures of the electrode 220 and the light guide layer 225 may be selectively applicable to the disclosed embodiments.

When the electrode 220 includes an N-type semiconductor layer, the electrode 220 contacts a surface of the first conductive type semiconductor layer 210, e.g., an N-face. The lower portion 221 that is at least one side of the electrode 220 may contact the first conductive type semiconductor layer 210 with a width of less than about 3 µm. Also, a width of the lower portion 221 of the electrode 220 may be about 10% to about 90% of that of the upper portion 222.

The electrode 220 may have a thickness of less than about several to, e.g., less than 5 µm. The light guide layer 225 may have a thickness less than that of the electrode 220.

A ratio of the lower portion 221 of the electrode 220 to the light guide layer 225 may be about 1:9. A contact area of the light guide layer 225 may be less than the top surface of the electrode 220. For example, the contact area of the light guide layer 225 may be about 10% to about 90% of the top surface of the electrode 220. Thus, a width of the lower portion of the electrode 220 may be about 1/9 to about 9/9 of a width of the light guide layer 225.

Alternatively, the width of the light guide layer 225 may be about 1/9 to about 9/9 of the width of the lower portion of the electrode 220.

Here, when viewed from a top side of a chip, the electrode may have a width, i.e., one line width of less than several tens μm.

When viewed from a top side of the chip, an outer side surface of the light guide layer 225 includes at least one side surface having a side opposite to that of the lower portion 221 of the electrode 220 and protrudes to the outside.

Since the light guide layer 225 partially overlaps under the electrode 220, a portion of light proceeding from the inside of the first conductive type semiconductor layer into a surface may be extracted to the outside through the light guide layer 225. The light guide layer 225 may prevent the light from being absorbed by the electrode 220 to extract the light to the outside.

The active layer 220 is disposed under the first conductive type semiconductor layer 210. The active layer 220 may have at least one of a single quantum well structure, a multi quantum well (MQW) structure, a quantum dot structure, and a quantum wire structure. The active layer 220 may be formed at a cycle of a well layer/barrier layer using a Group III-V compound semiconductor material.

A pair of well layer/barrier layer of the active layer 220 may include one of an InGaN well layer/GaN barrier layer, a GaN well layer/AlGaN barrier layer, an InGaN well layer/AlGaN barrier layer, and an InGaN well layer/InGaN barrier layer. The active layer may have about 3 cycles to about 30 cycles. At least one barrier layer may be doped with a dopant such as indium or silicon or undoped, but is not limited thereto. The barrier layer may have a band gap greater than that of the well layer.

A conductive type clad layer may be disposed on/under the active layer 220. The conductive type clad layer may be formed of a GaN-based material or/and have a band gap greater than that of the well layer.

A second conductive type semiconductor layer 230 may be disposed under the active layer 220. The second conductive type semiconductor layer 230 may include at least one semiconductor layer, which is doped with a second conductive type dopant. The semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 230 may be formed of at least one selected from the group consisting of GaN, AlN, AlGaN, InGaN, InN, InAlGaN, AlInN, AlGaAs, GaP, GaAs, GaAsP, and AlGaInP.

The second conductive type semiconductor layer 230 may include a P-type semiconductor layer. The second conductive type dopant may include a P-type dopant such as Mg, Zn, Ca, Sr, or Ba.

A first conductive type semiconductor layer, e.g., an N-type semiconductor layer may be further disposed on the second conductive type semiconductor 230. The light emitting structure layer 235 may have one of an N—P junction structure, a P—N junction structure, an N—P—N junction structure, and a P—N—P junction structure. Hereinafter, for convenience of description, a structure in which the second conductive type semiconductor layer 230 is disposed at the lowermost layer of the light emitting structure layer 235 will be described as an example.

The light emitting structure layer 235 may have a vertical or inclined side surface Al with respect to a lower surface of the second conductive type semiconductor 230.

The passivation layer 250 and the first conductive layer 240 are disposed under the second conductive type semiconductor layer 230.

The passivation layer 250 is disposed around a device. Also, in a manufacturing process, the passivation layer 250 may be disposed in a region exposed by an isolation etching process, a channel region, or a chip boundary portion.

An inside part of the passivation layer 250 is disposed between the second conductive type semiconductor layer 230 and the first conductive layer 240, and an outside part is exposed to the outside than a side surface of the light emitting structure layer 235. A lower surface of the outside part of the passivation layer 250 may contact a top surface of the first conductive layer 240.

The passivation layer 250 may be disposed around a lower surface of the second conductive type semiconductor layer 230. The passivation layer 250 may be formed of a conductive material or a non-conductive material. When the passivation layer 250 is formed of the conductive material, an operation voltage may be reduced. Here, the passivation layer 250 may be formed of one of ITO, IZO, IZON, IZTO, IAZO, IGZO, IGTO, AZO, ATO, and GZO.

The passivation layer 250 may be formed of a material having conductivity less than that of the first conductive layer 240 or the second conductive layer 260. The passivation layer 250 may be formed of a material, which schottky-contacts the second conductive type semiconductor layer 230, e.g., at least one selected from the group consisting of Ti, Ni, Pt, Pd, Rh, Ir, and W. The passivation layer 250 may be formed of an insulation material or a conductive oxide material, e.g., one of ITO, IZO, IZON, IZTO, IAZO, IGZO, IGTO, AZO, ATO, GZO, $SiO_2$, $SiO_x$, $SiO_xN_y$, $Si_3N_4$, $Al_2O_3$, and $TiO_2$.

The passivation layer 250 may be disposed along a periphery of a lower portion of the second conductive type semiconductor layer 230 in a predetermined shape such as a polygonal shape, a circular shape, or a random shape. Also, the passivation layer 250 may have one of a frame shape, a ring shape, and a loop shape.

For example, when the passivation layer 250 is formed of a light-transmitting material such as ITO, a laser is transmitted in an isolation etching process. Thus, the outside of the light emitting structure layer 235 does not have an influence on an electric effect to improve electrical characteristics, thereby improving light emitting efficiency.

The passivation layer 250 may space the second conductive layer 260 from the light emitting structure layer 235. Also, the passivation layer 250 may improve an adhesion of the second conductive type semiconductor layer 230.

The first conductive layer 240 may include an ohmic layer or/and a reflective layer. The ohmic layer ohmic-contacts a lower portion of the second conductive type semiconductor layer 230. The ohmic layer may be formed of one of ITO, IZO, IZON, IZTO, IAZO, IGZO, IGTO, AZO, ATO, GZO, and a metal such as Ni or Ag. The reflective layer may include at least one layer formed of one of metals having a reflectance of about 50% or more, e.g., one of Ag, Ni, Al, Rh, Pd, Ir, Ru, Mg, Zn, Pt, Au, and Hf.

The first conductive layer 240 may reflect light incident into the light emitting structure layer 235 through the reflective metal to improve light extraction efficiency.

At least one of the first conductive layer 240 and the second conductive layer 260 may extend under the passivation layer 250.

The second conductive layer 260 may be formed as a barrier layer or a bonding layer under the first conductive layer 240. The second conductive layer 260 may be formed of at least one selected from the group consisting of Ti, Au, Sn, Ni, Cr, Ga, In, Bi, Cu, Ag, and Ta.

The support member 270 may be disposed under the second conductive layer 260. The support member 270 may be formed of a conductive material, e.g., copper, gold, or a carrier wafer such as Si, Ge, GaAs, ZnO, SiC, and SiGe. The support member 270 may not be provided or have a single- or two-layered structure according to a thickness or strength thereof. Alternatively, the support member 270 may be realized by a conductive sheet or an insulation material.

In a process of manufacturing the light emitting device 20, a first conductive type semiconductor layer 210, an active layer 220, and a second conductive semiconductor layer 230 are grown on a growth substrate (not shown). Then, a passivation layer 250, a first conductive layer 240, a second conductive layer 260, and a conductive support member 270 are formed on the second conductive type semiconductor layer 230. Thereafter, the growth substrate may be removed by a physical method (e.g., laser lift off) or/and a chemical method (wet etching). A light guide layer 225 and an electrode 220 are formed before or after an isolation etching process is performed to separate the substrate into a unit chip. The process is not limited to the embodiments.

Figure 23:
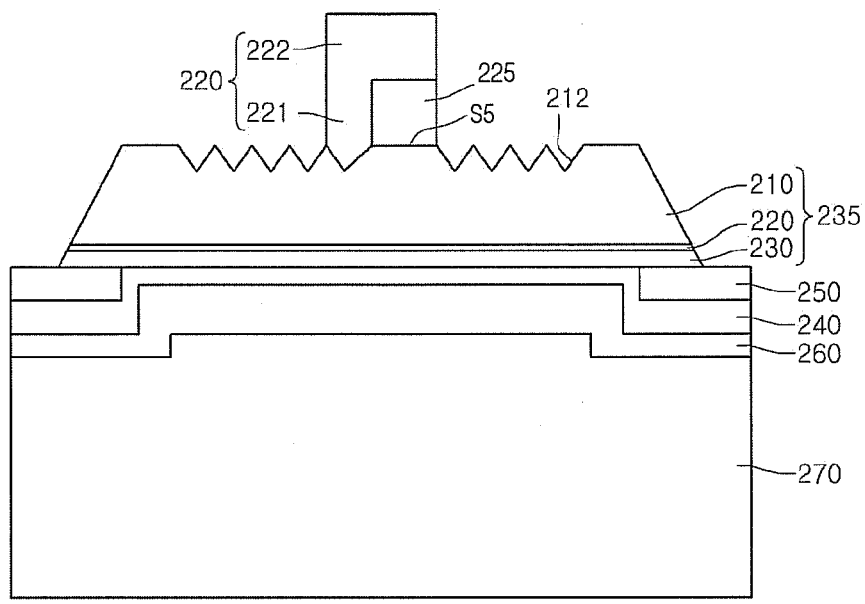
FIG. 23 is a side-sectional view of a light emitting device according to an eleventh embodiment.

FIG. 23 is a side-sectional view of a light emitting device according to an eleventh embodiment. In descriptions of the eleventh embodiment, the same part as that of the tenth embodiment will be described with reference to the tenth embodiment, and their duplicated descriptions will be omitted.

Referring to FIG. 23, a light emitting device 202 has a roughness 212 on a portion of a top surface of a first conductive type semiconductor layer 210. The roughness 212 may extend up to a lower surface of an electrode 220. A flat surface, but the roughness 212, may be disposed on a surface S5 contacting a light guide layer 225. Thus, light may be incident into the flat surface S5 of the light guide layer 225 to improve light extraction efficiency. Also, the roughness 212 disposed under the electrode 220 may prevent light from being absorbed.

Figure 24:
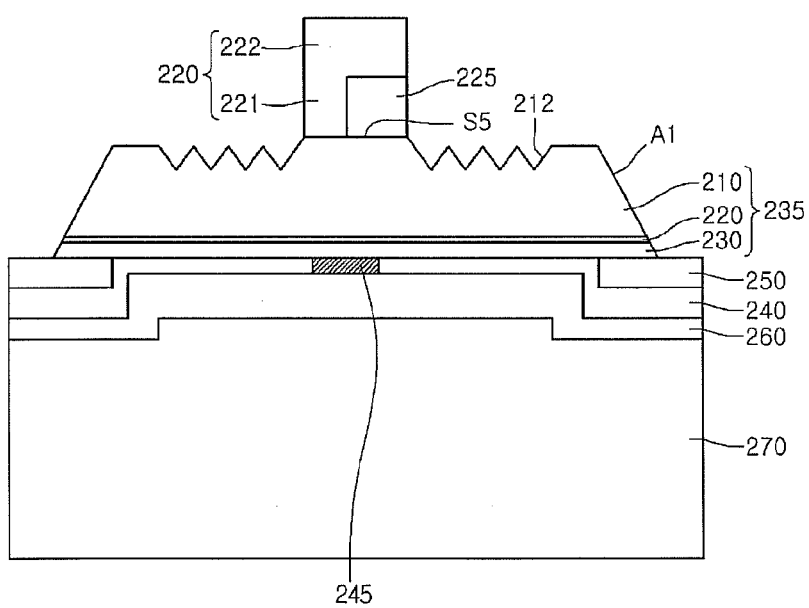
FIG. 24 is a side-sectional view of a light emitting device according to a twelfth embodiment.

FIG. 24 is a side-sectional view of a light emitting device according to a twelfth embodiment. In descriptions of the twelfth embodiment, the same part as that of the tenth embodiment will be described with reference to the tenth embodiment, and their duplicated descriptions will be omitted.

Referring to FIG. 24, a light emitting device 203 may include a current blocking layer 245 at a position corresponding to that of an electrode 220. The current blocking layer 245 may be disposed between a first conductive layer 240 and the second conductive type semiconductor layer 230.

The current blocking layer 245 may be formed of a material having conductivity less than that of the first conductive layer 240 or the second conductive layer 260, for example, at least one selected from the group consisting of ITO, IZON, IZTO, IAZO, IGZO, IGTO, AZO, ATO, GZO, ZnO, $SiO_2$, $SiO_x$, $SiO_xN_y$, $Si_3N_4$, $Al_2O_3$, $TiO_2$, Ti, Al, and Cr.

Here, when the first conductive layer 240 is formed of ITO, the current blocking layer 245 may be formed of an insulation material such as ZnO or $SiO_2$.

The current blocking layer 245 may overlap a position corresponding to that of a pattern of the electrode 220, i.e., a position corresponding to a lower portion 221 of the electrode 220. Alternatively, the current blocking layer 245 may be disposed inside the first conductive type semiconductor layer 210. The current blocking layer may be disposed in a region corresponding to the lower portion 221 of the electrode 220.

Figure 25:
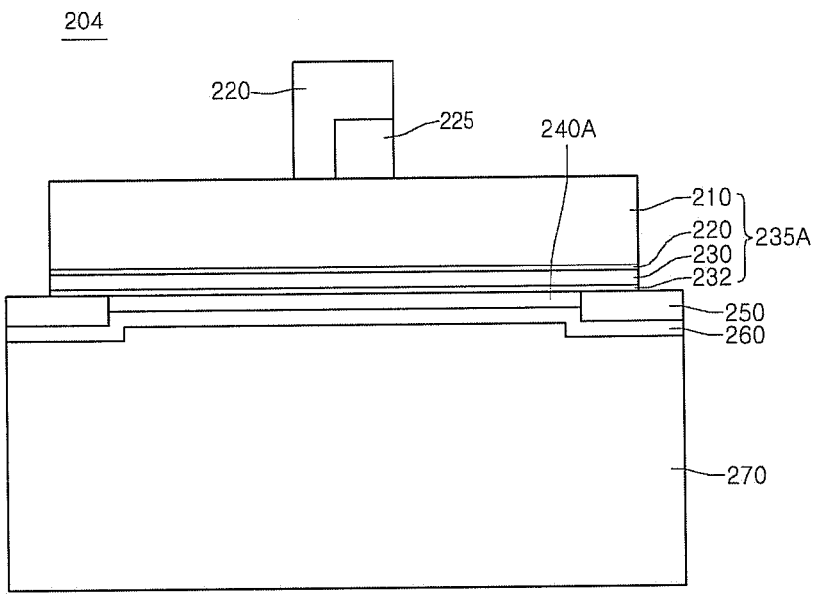
FIG. 25 is a side-sectional view of a light emitting device according to a thirteenth embodiment.

FIG. 25 is a side-sectional view of a light emitting device according to a thirteenth embodiment. In descriptions of the thirteenth embodiment, the same part as that of the tenth embodiment will be described with reference to the tenth embodiment, and their duplicated descriptions will be omitted.

Referring to FIG. 25, a light emitting device 204 includes an N—P—N or P—N—P type light emitting structure layer 235A. The light emitting structure layer 235A includes a first conductive type semiconductor layer 210, an active layer 220 under the first conductive type semiconductor layer 210, a second conductive type semiconductor layer 230 under the active layer 230, and a third conductive type semiconductor layer 232 under the second conductive type semiconductor layer 230.

When the first conductive type semiconductor layer 210 and the third conductive type semiconductor layer 230 include an N-type semiconductor layer, the second conductive type semiconductor layer 230 may include a P-type semiconductor layer, and vice versa.

A first conductive layer 240A is disposed under the inside of the third conductive type semiconductor layer 232, and a passivation layer 250 is disposed around a lower portion of the third conductive type semiconductor layer 232.

The second conductive layer 260 is disposed under the passivation 250 and the first conductive layer 240A. A conductive support member 270 is disposed under the second conductive layer 260. Since the first conductive layer 240A contacts only the third conductive type semiconductor layer 232, it may prevent the first conductive layer 240A from being laminated.

Figure 26:
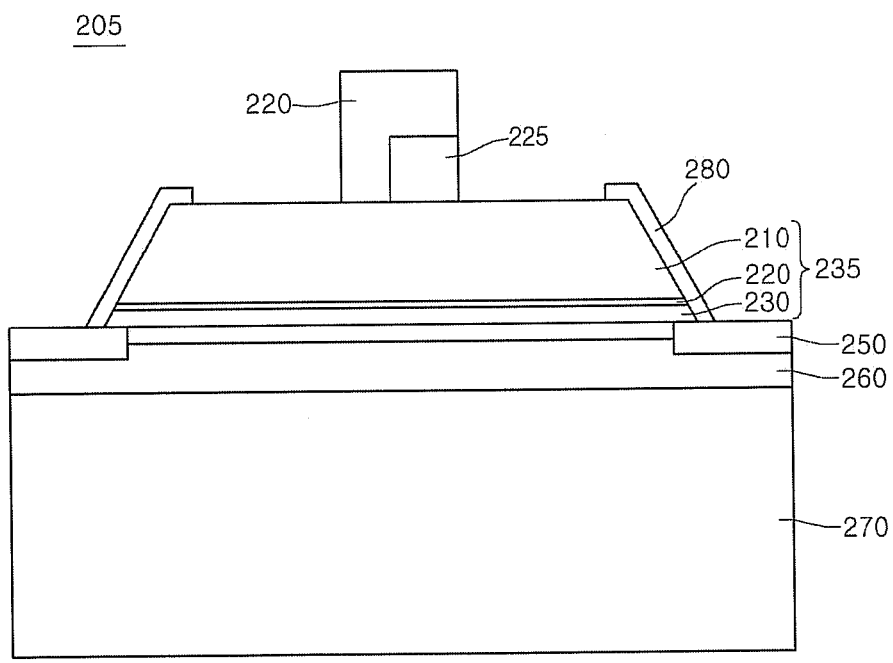
FIG. 26 is a side-sectional view of a light emitting device according to a fourteenth embodiment.

FIG. 26 is a side-sectional view of a light emitting device according to a fourteenth embodiment. In descriptions of the fourteenth embodiment, the same part as that of the tenth embodiment will be described with reference to the tenth embodiment, and their duplicated descriptions will be omitted.

Referring to FIG. 26, a light emitting device 205 has a structure in which an insulation layer 280 is disposed around a light emitting layer 235.

The insulation layer 280 may be formed of at least one selected from the group consisting of $SiO_2$, $SiO_2$, $SiO_xN_y$, $Si_3N_4$, $Al_2O_3$, and $TiO_2$. Since an upper end of the insulation layer 280 covers a periphery of a top surface of a first conductive type semiconductor layer 210, a lower end of the insulation layer 280 is disposed on a passivation layer 250. Thus, the insulation layer 280 may prevent an interlayer short from occurring on a periphery of the light emitting structure layer 235. Here, the insulation layer 280 may be formed of the same material as a light guide layer 225 and using the same process as that of the light guide layer 225.

The light emitting device according to the first to fourteenth embodiments may be packaged on a semiconductor layer formed of a resin material or silicon, an insulation substrate, or a ceramic substrate. Also, the light emitting device may be used as light sources for an indicating device, a lighting device, and a display device.

Figure 27:
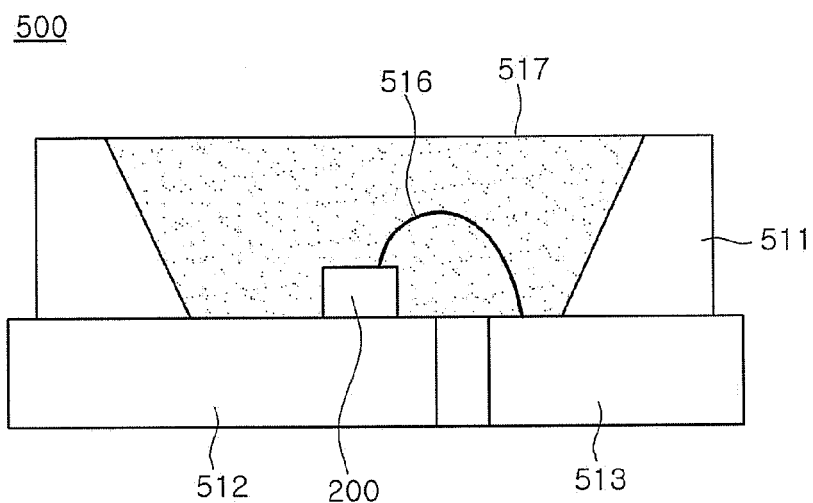
FIG. 27 is a side-sectional view of a light emitting device package according to a fifteenth embodiment.

FIG. 27 is a side-sectional view of a light emitting device package according to a fifteenth embodiment.

Referring to FIG. 27, a light emitting device package 500 includes a body 511, first and second lead electrodes 512 and 512 disposed on the body 511, a light emitting device 200 according to an embodiment, which is disposed on the body 511 and electrically connected to the first and second lead electrodes 512 and 513, and a molding member 517 surrounding the light emitting device 200.

The body 511 may be formed of a silicon material, a synthetic resin material, or a metal material. The body 511 has an upwardly opened cavity structure, and an inclined surface may be disposed around the light emitting device 200.

The first lead electrode 512 and the second lead electrode 513 are electrically separated from each other. The first and second lead electrodes 512 and 513 provide a power to the light emitting device 200. Also, the first and second lead electrodes 512 and 513 may reflect light emitted from the light emitting device 200 to improve light efficiency and discharge heat generated in the light emitting device 200 to the outside. Each of the first and second lead electrodes 512 and 513 may include at least one of a lead frame structure, a through hole structure, and a plating layer.

The light emitting device 200 may be disposed on the body 511 or the first or second lead electrode 512 or 513

The light emitting device 200 may be electrically connected to the first lead electrode 512 through a wire and electrically connected to the second lead electrode 513 through die-bonding.

The molding member 517 may surround the light emitting device 200 to protect the light emitting device 200. Also, a phosphor may be contained in the molding member 517 to change a wavelength of light emitted from the light emitting device 200.

<Lighting System>

The semiconductor light emitting device or a light emitting device package according to an embodiment may be provided in plurality. The plurality of light emitting devices or the light emitting device packages may be arrayed on the substrate. Optical members such as a light guide plate, a prism sheet, and a diffusion sheet may be disposed on a path of the light emitted from the light emitting device. The light emitting device package, the substrate, and the optical members may serve as a lighting unit. The lighting unit may be manufactured in a top view type or a side view type. Thus, the lighting unit may be provided as display devices for a portable terminal, a notebook computer, etc., or variously applied to the lighting device, the indicating device, etc. Also, in another embodiment, the lighting unit may be realized as a lighting system including the light emitting device or the light emitting device package according to the above-described embodiments. The lighting system may include display devices illustrated in FIGS. 28 and 29, a lighting device illustrated in FIG. 30, illumination lamps, signal lights, car headlights, electronic displays, and the like.

Figure 28:
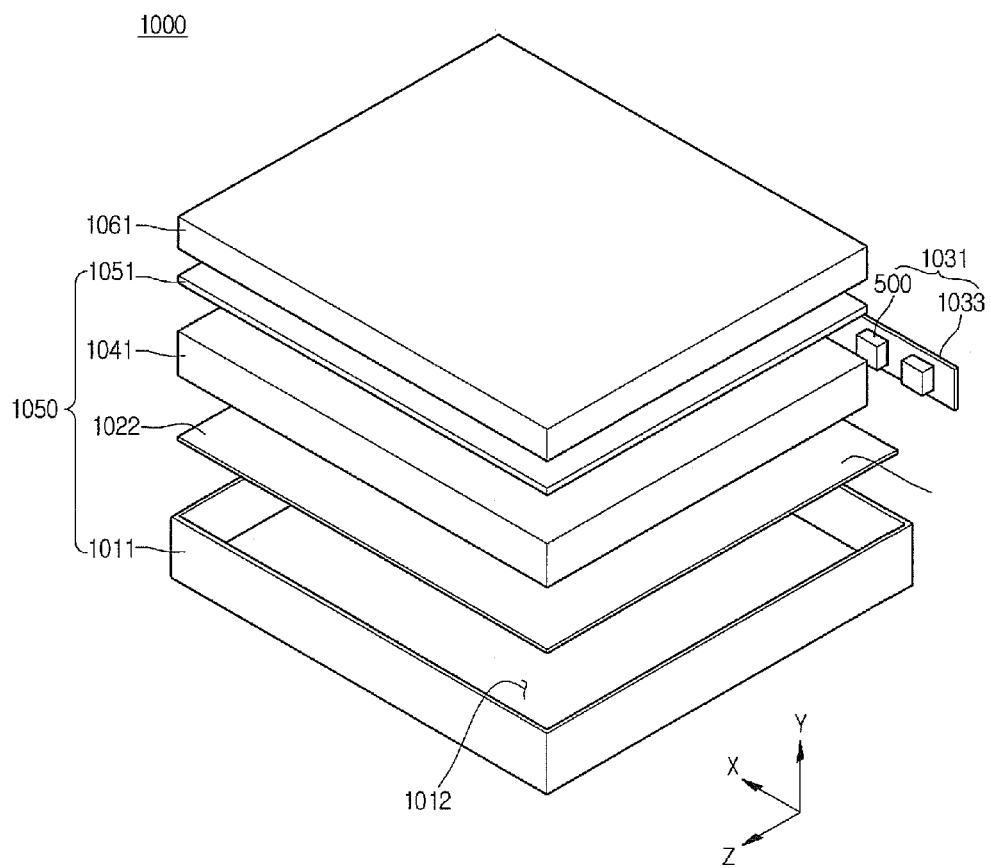
FIG. 28 is a diagram illustrating a display device according to an embodiment.

FIG. 28 is an exploded perspective view illustrating a display device according to an embodiment.

Referring to FIG. 28, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 500 according to the above-disclosed embodiment. The light emitting device package 500 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 500 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 500 may be installed on the substrate 1033 so that a light-emitting surface is separated from the light guide plate 1041 by a predetermined distance, and there is no limit for this. The light emitting device package 500 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET (Polyethylene terephthalate), PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

Figure 29:
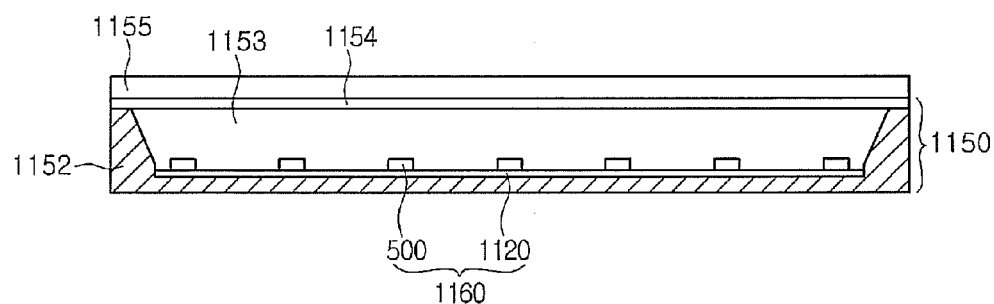
FIG. 29 is a diagram illustrating another display device according to an embodiment.

FIG. 29 is a diagram illustrating a display device according to an embodiment.

Referring to FIG. 29, a display device 1100 includes a bottom cover 1152, a substrate 1120, an optical member 1154, and a display panel 1155. Herein, the above-disclosed light emitting device packages 500 are arrayed on the substrate 1120.

The substrate 1120 and the light emitting device package 500 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may include at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

Figure 30:
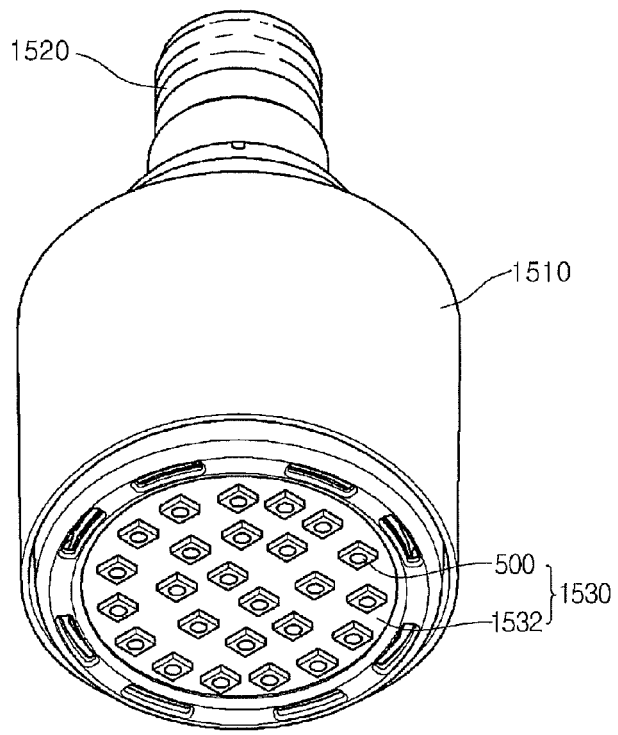
FIG. 30 is a diagram illustrating a lighting device according to an embodiment.

FIG. 30 is a perspective view illustrating an lighting device according to an embodiment.

Referring to FIG. 30, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 500 according to the embodiment installed on the substrate 1532. The plurality of light emitting device packages 500 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 500 may be installed on the substrate 1532. Each of the light emitting device packages 500 may include at least one Light Emitting Diode (LED) chip. The LED chip may include a light emitting diode of visible light such as red, green, blue, or white or a UV light emitting diode which emits Ultra Violet (UV).

A combination of various light emitting device packages 500 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

The light emitting device according to the embodiment(s) may be packaged onto a semiconductor substrate formed of a resin material or silicon, an insulation substrate, or a ceramic substrate and used as light sources for an indicating device, a lighting device, and a display device. Also, each of the foregoing embodiments may not be limited to each of embodiments and applied to the foregoing other embodiments, but are not limited thereto.

The light emitting device or the light emitting device package according to the embodiments may be applicable to a lighting system. The lighting system may include a structure in which the plurality of light emitting devices or the plurality of light emitting device packages is arrayed.

According to the embodiments, the light extraction efficiency may be improved in the light emitting device. Also, the contact region of the electrode may be reduced on the surface of the semiconductor layer to improve the light extraction efficiency on the surface of the semiconductor layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure layer comprising a first semiconductor layer, a second semiconductor layer under a bottom surface of the first semiconductor layer, and an active layer between the first semiconductor layer and the second semiconductor layer;
an electrode on a top surface of the first semiconductor layer;
a first layer including a transmittive oxide material between the top surface of the first semiconductor layer and the electrode; and
a second layer disposed between the first layer and the electrode to transmit a light incident through the first layer,
wherein the first layer is formed of a different material than the second layer,
wherein the electrode comprises a lower portion connected to the first semiconductor layer and an upper portion on a top surface of the second layer,
wherein the upper portion of the electrode includes a first region on a top surface of the second layer and a second region on the lower portion,
wherein the first region of the upper portion of the electrode protrudes outwardly from the second region,
wherein the first layer and the second layer vertically overlap with the first region that is protruded at the upper portion of the electrode,
wherein a bottom surface of the first layer has a width wider than a width of a top surface of the upper portion of the electrode,
wherein the electrode is formed of a reflective metal material,
wherein the lower portion and the upper portion of the electrode are integrally formed of the reflective metal material,
wherein a bottom surface of the lower portion of the electrode directly contacts the top surface of the first semiconductor layer which is disposed under the first layer,
wherein the first layer and the second layer directly contact an inner surface of the lower portion of the electrode,
wherein the second layer has plurality of outer side surfaces spaced apart from an outside of the electrode,
wherein the lower portion of the electrode physically contacts the top surface of the first semiconductor layer and has a width with a range of about 1/9 to about 5/6 of a width of the second layer, and
wherein the lower portion of the electrode has the width of less than about 3 μm.

2. The light emitting device of claim 1, wherein the top surface of the upper portion of the electrode has a width wider than the bottom surface of the lower portion of the electrode.

3. The light emitting device of claim 1, wherein the second layer directly contacts the first layer and a bottom surface of the first region of the upper portion of the electrode.

4. The light emitting device of claim 1, wherein one of the first layer and the second layer is formed of an insulation material and the other one of the first layer and the second layer is formed of a conductive material.

5. The light emitting device of claim 1, wherein the electrode is formed in a multi-layered structure and a top layer of the multi-layered structure includes an Au layer.

6. The light emitting device of claim 2, wherein the width of the bottom surface of the lower portion is about 10% to about 90% of the width of one side of the top surface of the upper portion of the electrode.

7. A light emitting device comprising:
a light emitting structure layer comprising a first semiconductor layer, a second semiconductor layer under a bottom surface of the first semiconductor layer, and an active layer between the first semiconductor layer and the second semiconductor layer;
a first layer;
a second layer; and
an electrode on a top surface of the first semiconductor layer, the electrode including a lower portion connected to the first semiconductor layer and an upper portion on a top surface of the second layer, wherein the upper portion of the electrode includes a first region on a top surface of the second layer and a second region on the lower portion, wherein the first layer including a transmittive oxide material between the top surface of the first semiconductor layer and the first region of the upper portion of the electrode,
the second layer disposed between the first layer and the first region of the upper portion of the electrode, the second layer formed of a transmissive material,
wherein the first layer is formed of a different material than the second layer,
wherein the first layer has a hole therein,
wherein a part of the lower portion of the electrode is disposed in the hole of the first layer,
wherein the first region of the upper portion of the electrode protrudes outwardly from the second region,
wherein the first layer and the second layer vertically overlap with the first region that is protruded at the upper portion of the electrode,
wherein a bottom surface of the first layer has a width wider than a width of a top surface of the upper portion of the electrode,
wherein the electrode is formed of a reflective metal material,
wherein the lower portion and the upper portion of the electrode are integrally formed of the reflective metal material,
wherein a bottom surface of the lower portion of the electrode directly contacts a region of the top surface of the first semiconductor layer which is disposed under the first layer, and
wherein the first layer and the second layer directly contact an inner surface of the lower portion of the electrode,
wherein the second layer has plurality of outer side surfaces spaced apart from an outside of the electrode,
wherein the lower portion of the electrode physically contacts the top surface of the first semiconductor layer and has a width with a range of about 1/9 to about 5/6 of a width of the second layer, and
wherein the lower portion of the electrode has the width of less than about 3 μm.

8. The light emitting device of claim 7, wherein the lower portion of the electrode directly contacts inner sides of the first and second layers.

9. The light emitting device of claim 7, wherein the first layer contacts the first semiconductor layer, and wherein the top surface of the first semiconductor layer has a rough surface around the lower portion of the electrode.

10. The light emitting device of claim 9, wherein the at least one of the first and second layers includes a conductive material.

11. The light emitting device of claim 7, wherein a width of the bottom surface of the lower portion of the electrode is about 10% to about 90% of a width of the top surface of the upper portion of the electrode.

12. A light emitting device comprising:
a light emitting structure layer comprising a first semiconductor layer, a second semiconductor layer under a bottom surface of the first semiconductor layer, and an active layer between the first semiconductor layer and the second semiconductor layer;
an electrode on a top surface of the first semiconductor layer;
a support member under the light emitting structure layer,
a first layer including a transmittive oxide material between the top surface of the first semiconductor layer and the electrode; and
a second layer disposed between the first layer and the electrode to transmit a light incident through the first layer,
wherein the first layer is formed of a different material than the second layer,
wherein the electrode comprises a lower portion connected to the first semiconductor layer and an upper portion on a top surface of the second layer,
wherein the support member includes an insulation material,
wherein one of the first layer and the second layer is formed of an insulation material and the other one of the first layer and the second layer is formed of a conductive material,
wherein the first semiconductor layer includes a p-type dopant,
wherein the upper portion of the electrode includes a first region on a top surface of the second layer and a second region on the lower portion,
wherein the first region of the upper portion of the electrode protrudes outwardly from the second region,
wherein the first layer and the second layer vertically overlap with the first region that is protruded at the upper portion of the electrode,
wherein a bottom surface of the first layer has a width wider than a width of a top surface of the upper portion of the electrode,
wherein the electrode is formed of a reflective metal material,
wherein the lower portion and the upper portion of the electrode are integrally formed of the reflective metal material,
wherein a bottom surface of the lower portion of the electrode directly contacts the top surface of the first semiconductor layer which is disposed under the first layer, and wherein the first layer and the second layer directly contact an inner surface of the lower portion of the electrode,
wherein the second layer has plurality of outer side surfaces spaced apart from an outside of the electrode,
wherein the lower portion of the electrode physically contacts the top surface of the first semiconductor layer and has a width with a range of about ⅕ to about ⅖ of a width of the second layer, and
wherein the lower portion of the electrode has the width of less than about 3 μm.

13. The light emitting device of claim 12, wherein the other one of the first layer and the second layer is formed of one of ITO, IZO, IZON, IZTO, IAZO, IGZO, IGTO, AZO, ATO, and GZO.

14. The light emitting device of claim 12, wherein the first layer has a hole therein and a part of the lower portion of the electrode is disposed in the hole,
wherein a width of a bottom surface of the lower portion of the electrode is about 10% to about 90% of a width of the top surface of the upper portion of the electrode.

15. The light emitting device of claim 12, wherein inner surfaces of the other one of the first layer and the second layer contacting the electrode have an area smaller than outer surfaces of the other one of the first layer and the second layer that do not contact the electrode.

16. The light emitting device of claim 4, wherein inner surfaces of the other one of the first layer and the second layer contacting the electrode have an area smaller than outer surfaces of the other one of the first layer and the second layer that do not contact the electrode.

17. The light emitting device of claim 12, wherein the electrode is formed in a multi-layered structure, and
wherein an interval between the top surface of the first semiconductor layer and a bottom surface of the first region of the upper portion of the electrode is greater than a thickness of the first layer.

18. The light emitting device of claim 1, wherein the first layer has an area of about 60% to about 95% of the top surface of the first semiconductor layer, and
wherein the top surface of the first semiconductor layer has a rough surface around the lower portion of the electrode.

19. The light emitting device of claim 18, wherein an interval between the top surface of the first semiconductor layer and a bottom surface of the first region of the upper portion of the electrode is greater than a thickness of the first layer.

20. The light emitting device of claim 7, wherein an interval between the top surface of the first semiconductor layer and a bottom surface of the first region of the upper portion of the electrode is greater than a thickness of the first layer.

* * * * *